(12) United States Patent
Koduri

(10) Patent No.: US 11,094,620 B2
(45) Date of Patent: Aug. 17, 2021

(54) INTEGRATED CAPACITOR WITH EXTENDED HEAD BUMP BOND PILLAR

(71) Applicant: Texas Instruments Incorporated, Dallas, TX (US)

(72) Inventor: Sreenivasan K Koduri, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/588,138

(22) Filed: Sep. 30, 2019

(65) Prior Publication Data
US 2021/0098348 A1 Apr. 1, 2021

(51) Int. Cl.
| H01L 23/495 | (2006.01) |
| H01L 23/00 | (2006.01) |
| H01L 21/48 | (2006.01) |
| H01L 21/288 | (2006.01) |
| H01L 21/56 | (2006.01) |
| H01L 49/02 | (2006.01) |

(52) U.S. Cl.
CPC ...... *H01L 23/49589* (2013.01); *H01L 21/288* (2013.01); *H01L 21/4825* (2013.01); *H01L 21/56* (2013.01); *H01L 24/05* (2013.01); *H01L 28/60* (2013.01)

(58) Field of Classification Search
CPC .............. H01L 23/49589; H01L 21/288; H01L 21/4825; H01L 21/56; H01L 24/05; H01L 28/60
See application file for complete search history.

(56) References Cited

U.S. PATENT DOCUMENTS

| 6,117,747 | A | 9/2000 | Shao et al. | |
| 6,180,265 | B1 | 1/2001 | Erickson | |
| 2002/0037643 | A1* | 3/2002 | Ishimaru | H01L 23/53238 438/642 |
| 2002/0192921 | A1 | 12/2002 | Hsue et al. | |
| 2004/0104451 | A1* | 6/2004 | Ooi | H01L 24/05 257/532 |
| 2008/0290459 | A1 | 11/2008 | Barth et al. | |

(Continued)

OTHER PUBLICATIONS

PCT Search Report PCT/US2020/053089 2 pgs.

*Primary Examiner* — Victor A Mandala
(74) *Attorney, Agent, or Firm* — Dawn Jos; Charles A. Brill; Frank D. Cimino

(57) ABSTRACT

A microelectronic device has a die with a first electrically conductive pillar, and a second electrically conductive pillar, mechanically coupled to the die. The microelectronic device includes a first electrically conductive extended head electrically coupled to the first pillar, and a second electrically conductive extended head electrically coupled to the second pillar. The first pillar and the second pillar have equal compositions of electrically conductive material, as a result of being formed concurrently. Similarly, the first extended head and the second extended head have equal compositions of electrically conductive material, as a result of being formed concurrently. The first extended head provides a bump pad, and the second extended head provides at least a portion of a first plate of an integrated capacitor. A second plate may be located in the die, between the first plate and the die, or on an opposite of the first plate from the die.

15 Claims, 11 Drawing Sheets

(56) References Cited

U.S. PATENT DOCUMENTS

| | | | |
|---|---|---|---|
| 2009/0237900 A1* | 9/2009 | Origuchi | H01L 24/82 361/763 |
| 2009/0309212 A1* | 12/2009 | Shim, II | H01L 23/3107 257/700 |
| 2011/0062549 A1* | 3/2011 | Lin | H01L 23/5389 257/531 |
| 2019/0157108 A1* | 5/2019 | Liao | H01L 21/4857 |
| 2019/0311980 A1* | 10/2019 | Eid | H01G 4/1254 |
| 2020/0006258 A1* | 1/2020 | Aleksov | H01L 28/40 |
| 2020/0066622 A1* | 2/2020 | Jain | H01G 4/228 |
| 2020/0235716 A1* | 7/2020 | Eid | H03H 9/542 |
| 2020/0378845 A1* | 12/2020 | Bergemont | G01L 1/18 |

* cited by examiner

US 11,094,620 B2

1

INTEGRATED CAPACITOR WITH EXTENDED HEAD BUMP BOND PILLAR

FIELD

This disclosure relates to the field of microelectronic devices. More particularly, this disclosure relates to integrated capacitors in microelectronic devices.

BACKGROUND

Some microelectronic devices operate at high frequencies, and have use for capacitors to condition high frequency currents. Such capacitors should be closely integrated with the microelectronic devices to attain the better performance. However, capacitors require significant area, and may undesirably increase sizes of the microelectronic devices.

SUMMARY

The present disclosure introduces a microelectronic device having a die with a connection surface, a first electrically conductive pillar, and a second electrically conductive pillar. The pillars are mechanically coupled to the connection surface. The microelectronic device includes a first electrically conductive extended head electrically coupled to the first pillar, and a second electrically conductive extended head electrically coupled to the second pillar. The first pillar and the second pillar have equal compositions of electrically conductive material, and the first extended head and the second extended head have equal compositions of electrically conductive material. The first extended head provides a bump pad of the microelectronic device, and the second extended head provides at least a portion of a plate of an integrated capacitor of the microelectronic device. The microelectronic device is formed by concurrently forming the first pillar and the second pillar, and concurrently forming the first extended head and the second extended head.

DETAILED DESCRIPTION

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

A microelectronic device has a die, such as an integrated circuit, a discrete semiconductor device, a microelectromechanical system (MEMS) device, or a microfluidics device. The die has a connection surface. External electrical connections to components of the microelectronic device are made at the connection surface. The microelectronic device includes a first pillar and a second pillar, both electrically conductive, which are mechanically coupled to the connection surface. The first pillar and the second pillar have equal compositions of electrically conductive material. The microelectronic device includes a first extended head electrically coupled to the first pillar, and a second extended head electrically coupled to the second pillar. The first extended head and the second extended head are both electrically conductive, and have equal compositions of electrically conductive material. The first extended head provides a bump pad, and the second extended head provides at least a portion of a first plate of an integrated capacitor of the microelectronic device. A second plate of the integrated capacitor may be located above or below the first plate. The microelectronic device is formed by concurrently forming the first pillar and the second pillar, and by concurrently forming the first extended head and the second extended head.

It is noted that terms such as over, above, under, and below may be used in this disclosure. These terms should not be construed as limiting the position or orientation of a structure or element, but should be used to provide spatial relationship between structures or elements.

Figure 1A:
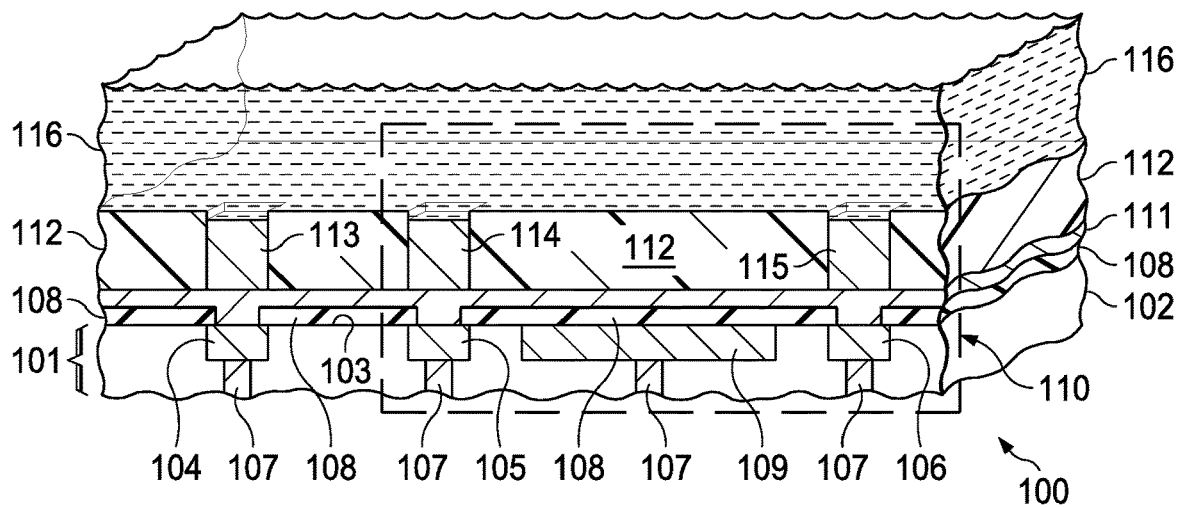
FIG. 1A through FIG. 1G are cross sections of an example microelectronic device having an integrated capacitor, depicted in stages of an example method of formation.

FIG. 1A through FIG. 1G are cross sections of an example microelectronic device having an integrated capacitor, depicted in stages of an example method of formation. Referring to FIG. 1A, the microelectronic device 100 includes a die 101. The die 101 may be implemented as an integrated circuit, a discrete semiconductor device, a MEMS device, or a microfluidics device, for example. The die 101 of this example has a substrate 102, which may include a semiconductor material, such as silicon, or a dielectric material such as silicon dioxide, silicon nitride, silicon oxynitride, glass, sapphire, ceramic, or polymer material, such as polyimide, silicone, or polyethylene. The substrate 102 may be part of a wafer or workpiece containing additional die, or may contain only the die 101. The die 101 has a connection surface 103; the substrate 102 may extend to the connection surface 103 as depicted in FIG. 1A.

The die 101 of this example includes a first terminal 104, a second terminal 105, and a third terminal 106 at the connection surface 103. The first terminal 104, the second terminal 105, and the third terminal 106 are electrically conductive, and may include, for example, aluminum, copper, nickel, palladium, platinum, gold, titanium, or tungsten. The first terminal 104, the second terminal 105, and the third terminal 106 may be implemented as bump bond pads or through-substrate vias, by way of example. The first terminal 104, the second terminal 105, and the third terminal 106 may be electrically coupled to components in the die 101 by vias 107 or other interconnect elements. A protective overcoat (PO) layer 108 may be disposed over the connection surface 103, with openings that expose the first terminal 104, the second terminal 105, and the third terminal 106. The PO layer 108 may include silicon dioxide, silicon nitride, silicon oxynitride, or polyimide, by way of example. The PO layer 108 may optionally be part of the die 101.

The die 101 of this example includes a second plate 109 of the integrated capacitor 110. The second plate 109 may have a composition of electrically conductive material similar to the first terminal 104, the second terminal 105, and the third terminal 106. The second plate 109 may be covered by the PO layer 108, as depicted in FIG. 1A. The second plate 109 may be electrically coupled to components in the die 101 by one or more of the vias 107.

A first interface layer 111 is formed over the connection surface 103, contacting the terminals 104, 105, and 106. The first interface layer 111 is electrically conductive. The first interface layer 111 may include an adhesion sublayer, not shown in FIG. 1A, contacting the PO layer 108 and the terminals 104, 105, and 106. The adhesion sublayer may include titanium or tungsten, for example, to provide adhesion of the first interface layer 111 to the PO layer 108 and the terminals 104, 105, and 106. The first interface layer 111 may include a barrier sublayer, not shown in FIG. 1A, on the adhesion sublayer. The barrier sublayer may include nickel, cobalt, tantalum, tantalum nitride, titanium, or titanium nitride, for example, to reduce diffusion of copper from a first pillar 113, a second pillar 114, and a third pillar 115, into the die 101. Copper diffusion into the die 101 may degrade performance of the microelectronic device 100. The first interface layer 111 may include a plating seed sublayer, not shown in FIG. 1A, on the barrier sublayer. The plating seed sublayer may include copper, nickel, or gold, to provide a low resistance layer suitable for electroplating. The first interface layer 111 may be formed by a sequence of sputter processes, evaporation processes, cold spray processes, or other thin film deposition processes.

A pillar mask 112 is formed on the first interface layer 111. The pillar mask 112 exposes the first interface layer 111 in areas for the first pillar 113, the second pillar 114, and the third pillar 115. The area for the first pillar 113 is located over the first terminal 104, the area for the second pillar 114 is located over the second terminal 105, and the area for the third pillar 115 is located over the third terminal 106. The pillar mask 112 may include photoresist, and may be formed using a photolithographic process. Alternatively, the pillar mask 112 may be formed by a tape application process, an additive process such as material jetting or material extrusion, or a subtractive process such as laser ablation. The pillar mask 112 may have a thickness of 1 micron to 100 microns, by way of example.

The first pillar 113, the second pillar 114, and the third pillar 115 are formed concurrently on the first interface layer 111 in the areas exposed by the pillar mask 112 by a first plating process using a first plating solution 116. The first plating solution 116 may include copper ions, so that the pillars 113, 114, and 115 include copper. The first plating solution 116 may include other metal ions, such as nickel ions or gold ions, in addition to the copper ions, so that the pillars 113, 114, and 115 include nickel or gold, to provide desired mechanical properties in the pillars 113, 114, and 115. The first plating process may be implemented as an electroplating process in which current is flowed from the first plating solution 116 to the first interface layer 111, providing more consistent plating rates. Alternatively, the first plating process may be implemented as an electroless process, reducing fabrication complexity of the microelectronic device 100. The pillars 113, 114, and 115 may have heights, perpendicular to the connection surface 103, of 1 micron to 100 microns, by way of example. The pillars 113, 114, and 115 are thus mechanically coupled to the connection surface 103 through the first interface layer 111. The microelectronic device 100 is separated from the first plating solution 116 after the pillars 113, 114, and 115 are formed. The pillar mask 112 is left in place for subsequent fabrication steps.

Figure 1B:
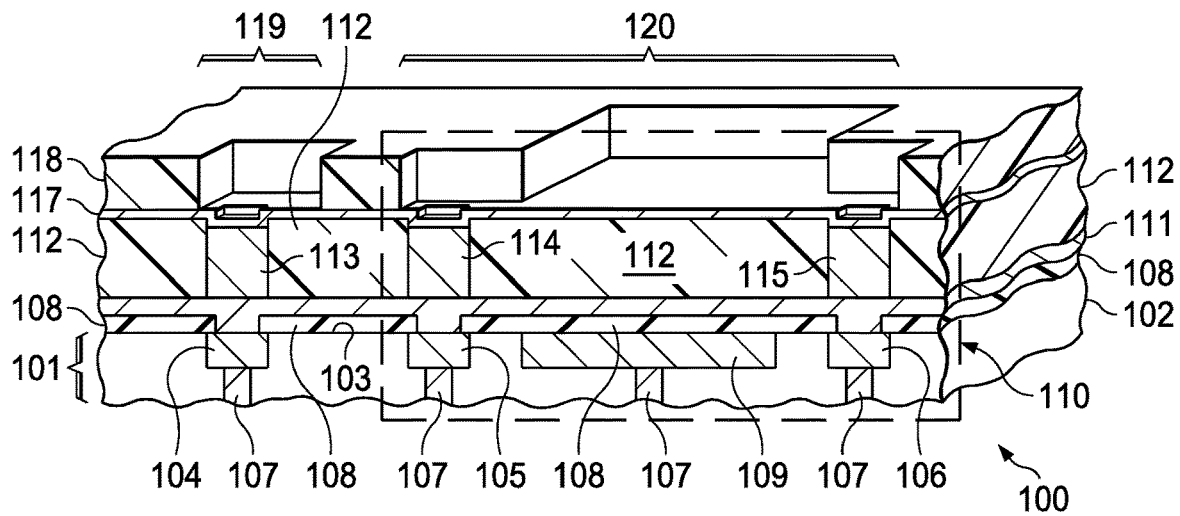

Referring to FIG. 1B, a second interface layer 117 is formed over the pillar mask 112, contacting the pillars 113, 114, and 115. The second interface layer 117 is electrically conductive. The second interface layer 117 may include an adhesion sublayer contacting the pillar mask 112 and the pillars 113, 114, and 115, and may include a plating seed sublayer contacting adhesion sublayer. The adhesion sublayer of the second interface layer 117 may have a composition similar to that disclosed in reference to the adhesion sublayer of the first interface layer 111. The plating seed sublayer of the second interface layer 117 may have a composition similar to that disclosed in reference to the plating seed sublayer of the first interface layer 111.

Figure 1C:
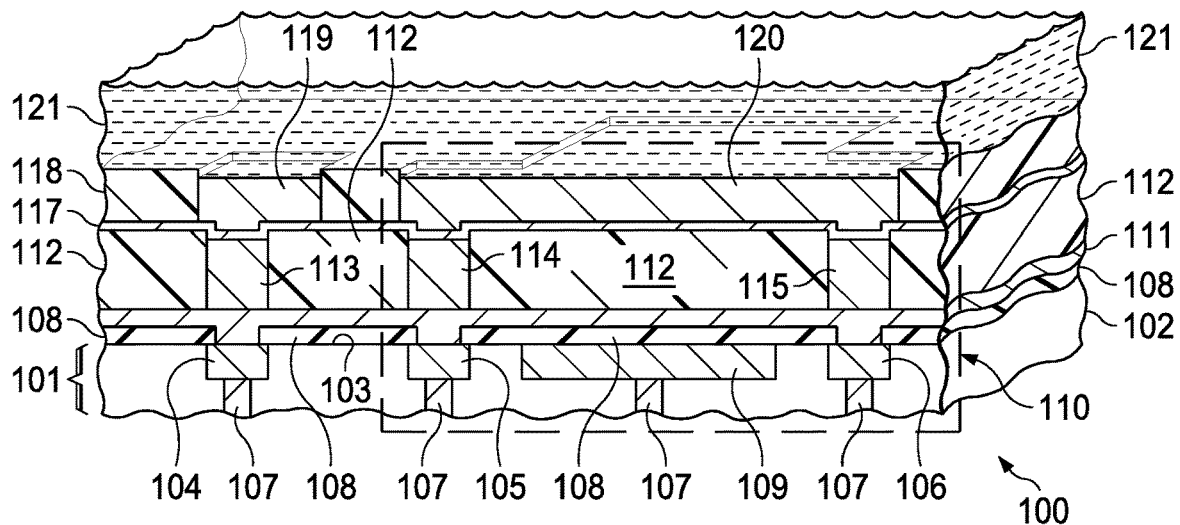

A head mask 118 is formed over the second interface layer 117. The head mask 118 exposes the second interface layer 117 in areas for a subsequently-formed first extended head 119 and a subsequently-formed second extended head 120; the first extended head 119 and the second extended head 120 are shown in FIG. 1C. Referring back to FIG. 1B, the area for the first extended head 119 exposes the second interface layer 117 over the first pillar 113, and extends past the first pillar 113 in at least one direction parallel to the connection surface 103. The area for the second extended head 120 exposes the second interface layer 117 over the second pillar 114 and the third pillar 115, extends past the second pillar 114 in at least one direction parallel to the connection surface 103, and extends past the third pillar 115 in at least one direction parallel to the connection surface 103. The head mask 118 may include photoresist, and may be formed using a photolithographic process. Alternatively, the head mask 118 may be formed by a tape application process, an additive process such as material jetting or material extrusion, or a subtractive process such as laser ablation. The head mask 118 may have a different composition than the pillar mask 112, or may be formed by a different process than the process used to form the pillar mask 112.

Referring to FIG. 1C, the first extended head 119 and the second extended head 120 are formed concurrently on the second interface layer 117 in the areas exposed by the head mask 118 by a second plating process using a second plating solution 121. The second plating solution 121 may include copper ions, so that the first extended head 119 and the second extended head 120 include copper. The second plating solution 121 may include other metal ions, such as nickel ions or gold ions, in addition to the copper ions, so that the first extended head 119 and the second extended head 120 include nickel or gold, to provide desired mechanical properties in the first extended head 119 and the second extended head 120. The second plating process may be implemented as an electroplating process in which current is flowed from the second plating solution 121 to the second interface layer 117, providing more consistent plating rates. Alternatively, the second plating process may be implemented as an electroless process, reducing fabrication complexity of the microelectronic device 100. The first extended head 119 and the second extended head 120 may have thicknesses, perpendicular to the connection surface 103, of 1 micron to 25 microns, by way of example. The first extended head 119 is electrically coupled to the first pillar 113 through the second interface layer 117, and extends past the first pillar 113 in at least one direction parallel to the connection surface 103. The second extended head 120 is electrically coupled to the second pillar 114 through the second interface layer 117, and extends past the second pillar 114 in at least one direction parallel to the connection surface 103. The microelectronic device 100 is separated from the second plating solution 121 after the first extended head 119 and the second extended head 120 are formed. The second extended head 120 is located over the second plate 109.

Figure 1D:
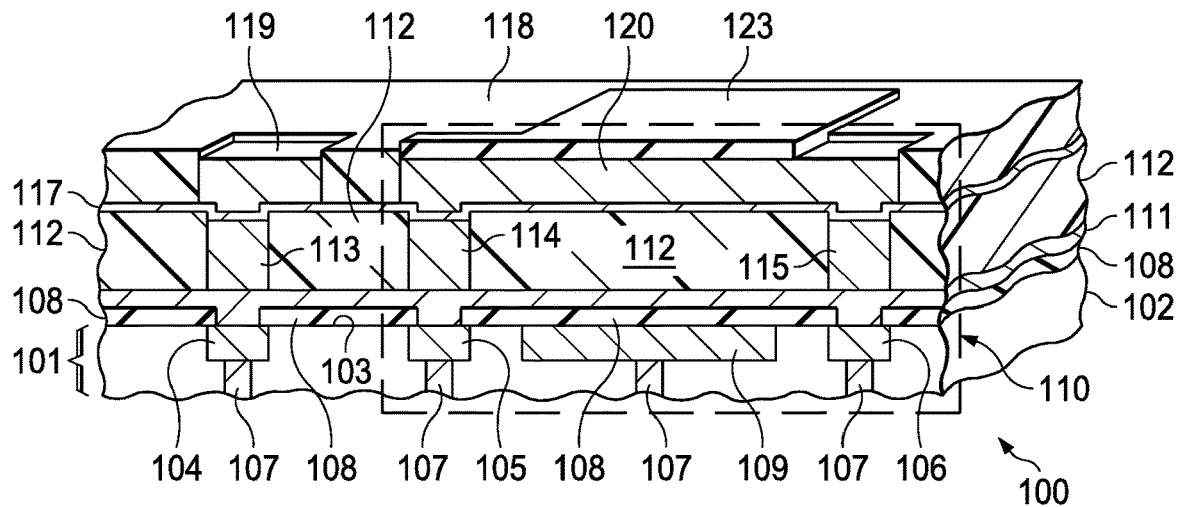

Referring to FIG. 1D, an isolation layer 123 is formed on the second extended head 120, covering a first portion of the second extended head 120 and exposing a second portion of the second extended head 120. The isolation layer 123 may be implemented as a solder mask, and may include, for example, epoxy, polyester, or resin, and may be formed by dispensing, screen printing, or a photolithographic process, by way of example.

Figure 1E:
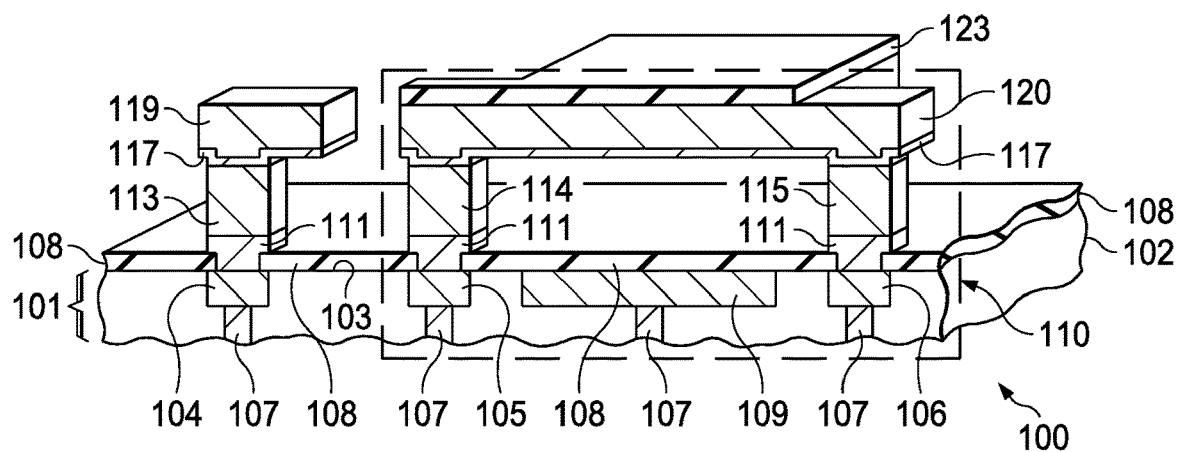

Referring to FIG. 1E, the head mask 118 of FIG. 1D is removed. The head mask 118 may be removed by dissolving in organic solvents, leaving the isolation layer 123 in place. After the head mask 118 is removed, the second interface layer 117 of FIG. 1D is removed where exposed by the first extended head 119 and the second extended head 120. The second interface layer 117 may be removed by one or more wet etch processes using dilute aqueous acid solutions. After the second interface layer 117 is removed where exposed by the first extended head 119 and the second extended head 120, the pillar mask 112 of FIG. 1D is removed. The pillar mask 112 may be removed by dissolving in organic solvents, leaving the isolation layer 123 in place. The pillar mask 112 may be removed by a process similar to that used to remove the head mask 118. After the pillar mask 112 is removed, the first interface layer 111 of FIG. 2D is removed where exposed by the first pillar 113, the second pillar 114, and the third pillar 115. The first interface layer 111 may be removed by one or more wet etch processes using dilute aqueous acid solutions, which may be similar to wet etch processes used to remove the second interface layer 117.

Figure 1F:
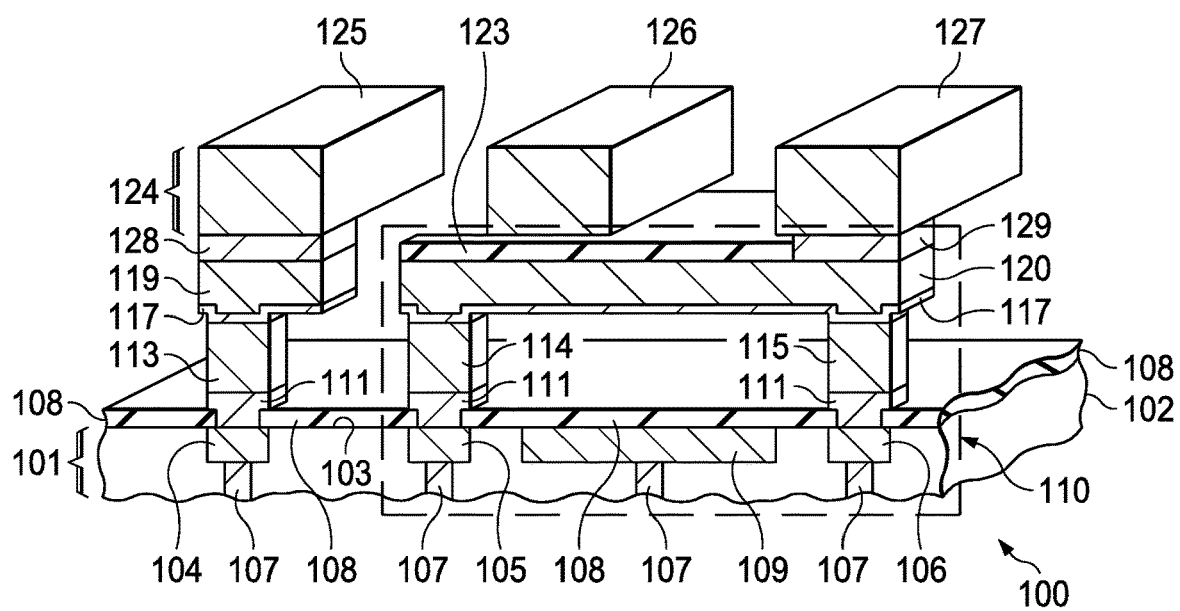

Referring to FIG. 1F, a lead frame 124 of the microelectronic device 100 is provided. The lead frame 124 includes a first lead 125, a second lead 126 and a third lead 127. The leads 125, 126, and 127 may include copper, stainless steel, or kovar, and may be plated with nickel, palladium, or gold, by way of example. The first extended head 119 provides a bump pad of the microelectronic device 100. The bump pad may be implemented as a solder bump pad or an adhesive bump pad, by way of example. The first lead 125 is electrically coupled to the first extended head 119 through a first solder connection 128, and the third lead 127 is electrically coupled to the second extended head 120 through a second solder connection 129 on the second portion of the second extended head 120 that is exposed by the isolation layer 123. In an alternate implementation of this example, the first lead 125 may be electrically coupled to the first extended head 119 through a first portion of an electrically conductive adhesive, such as an epoxy with copper or silver particles. In such an alternate implementation, the third lead 127 may be electrically coupled to the second extended head 120 through a second portion of the electrically conductive adhesive. The second lead 126 is electrically isolated from the second extended head 120 by the isolation layer 123. The integrated capacitor 110 may be used to capacitively couple signals from the third lead 127 of the lead frame 124 to the second plate 109 of the integrated capacitor 110. The integrated capacitor 110 may be formed so as to advantageously have a desired capacitance without consuming area in the die 101.

Figure 1G:
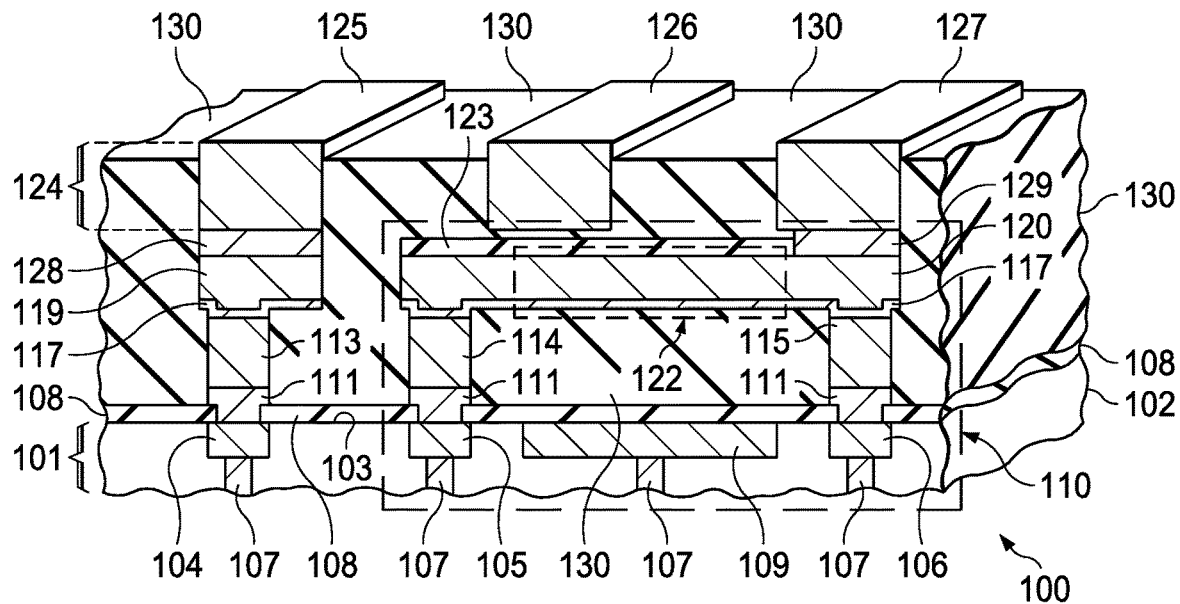

Referring to FIG. 1G, a package isolation structure 130 is formed on the die 101, laterally surrounding the pillars 113, 114, and 115, the first extended head 119, and the second extended head 120, and contacting the leads 125, 126, and 127. The term "laterally" refers to a direction parallel to the connection surface 103, and similarly for other examples disclosed herein. The package isolation structure 130 is electrically non-conductive, and may include dielectric material such as epoxy, silicone, or benzocyclobutene (BCB), and may include dielectric particles such as silicon dioxide particles, to reduce a thermal expansion coefficient of the package isolation structure 130. The second extended head 120 and the second interface layer 117 contacting the second extended head 120 provide a first plate 122 of the integrated capacitor 110. The package isolation structure 130 of this example extends between the first plate 122 of the integrated capacitor 110 and the second plate 109 of the integrated capacitor 110, which may advantageously provide a greater capacitance of the integrated capacitor 110 compared to a capacitor with no package dielectric material between plates of the capacitor. FIG. 1G depicts the completed microelectronic device 100.

Figure 2A:
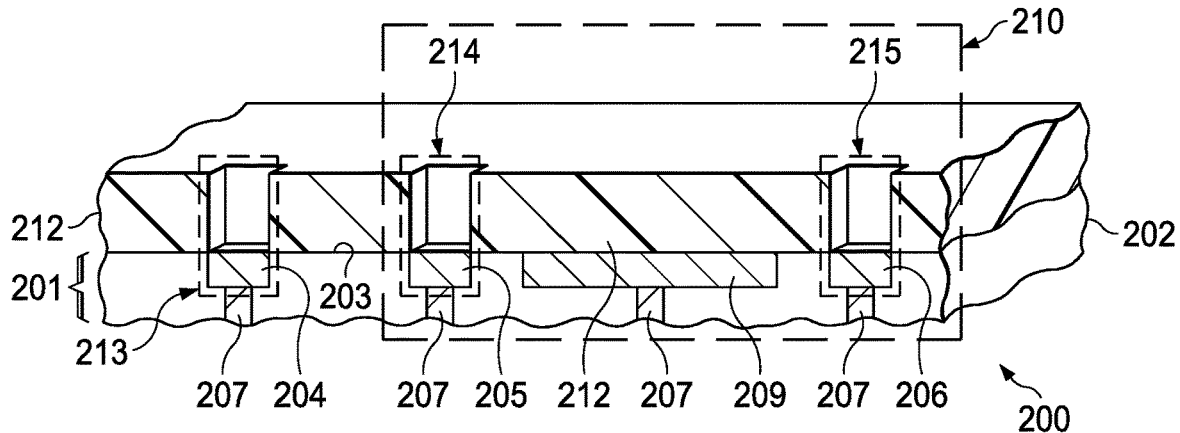
FIG. 2A through FIG. 2F are cross sections of another example microelectronic device having an integrated capacitor, depicted in stages of another example method of formation.
Figure 2B:
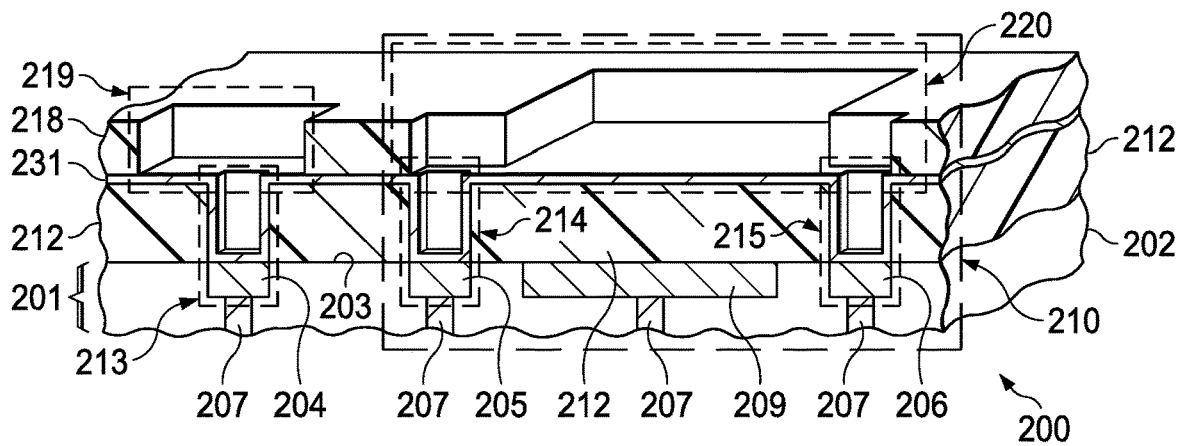
Figure 2C:
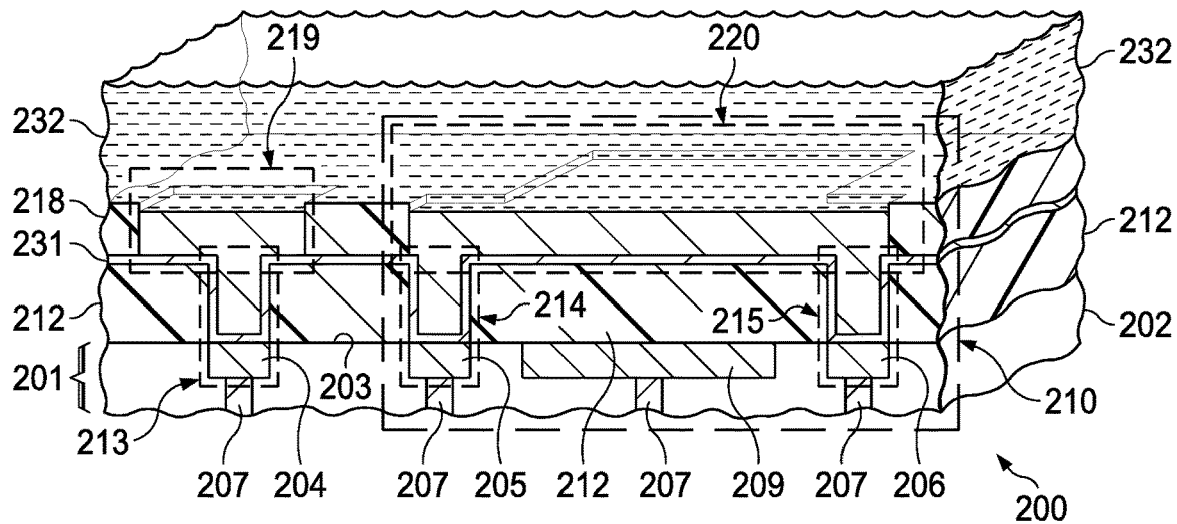
Figure 2D:
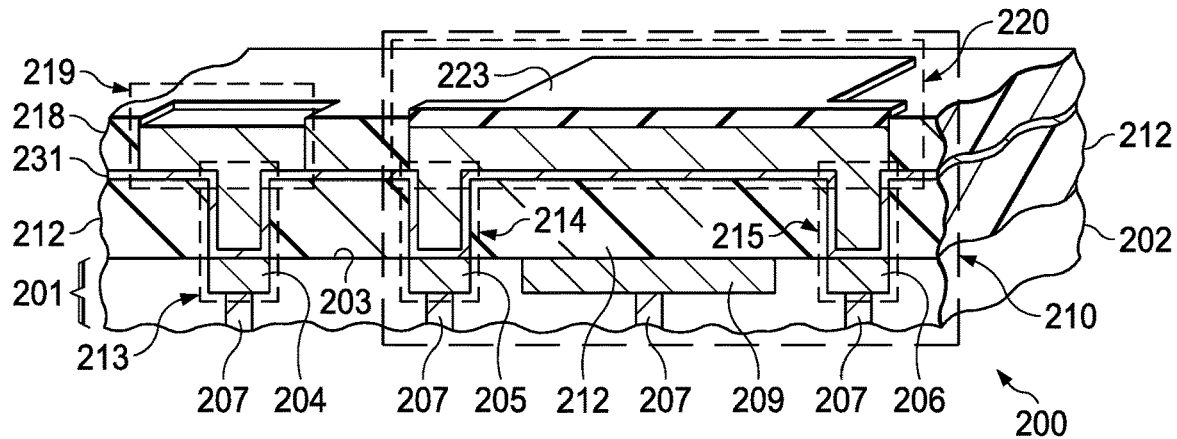

FIG. 2A through FIG. 2F are cross sections of another example microelectronic device having an integrated capacitor, depicted in stages of another example method of formation. Referring to FIG. 2A, the microelectronic device 200 includes a die 201. The die 201 may be implemented as any of the examples disclosed in reference to the die 101 of FIG. 1A, for example. The die 201 of this example has a substrate 202, which may be part of a wafer or workpiece containing additional die, or may contain only the die 201. The die 201 has a connection surface 203; the substrate 202 may extend to the connection surface 203 as depicted in FIG. 2A.

The die 201 of this example includes a first terminal 204, a second terminal 205, and a third terminal 206 at the connection surface 203. The first terminal 204, the second terminal 205, and the third terminal 206 are electrically conductive. The terminals 204, 205, and 206 may be implemented as bump bond pads or through-substrate vias, by way of example. The terminals 204, 205, and 206 may be electrically coupled to components in the die 201 by vias 207.

The die 201 of this example includes a second plate 209 of the integrated capacitor 210. The second plate 209 is electrically conductive. The second plate 209 may extend to the connection surface 203 as depicted in FIG. 2A. The second plate 209 may be electrically coupled to components in the die 201 by one or more of the vias 207.

A pillar mask 212 is formed on the connection surface 203. The pillar mask 212 exposes the first terminal 204 in an area for a subsequently-formed first pillar 213, exposes the second terminal 205 in an area for a subsequently-formed second pillar 214, and exposes the third terminal 206 in an area for a subsequently-formed third pillar 215. The pillar mask 212 of this example may be formed of photosensitive epoxy, using a photolithographic process. Alternatively, the pillar mask 212 of this example may include inorganic particles in a binder material, formed by an additive process such as material jetting or material extrusion. The pillar mask 212 may have a thickness of 1 micron to 100 microns, by way of example. The first pillar 213, the second pillar 214, and the third pillar 215 are shown in FIG. 2C.

Referring to FIG. 2B, an interface layer 231 is formed over the pillar mask 212, extending into the areas for the first pillar 213, the second pillar 214, and the third pillar 215, and contacting the first terminal 204, the second terminal 205, and the third terminal 206. The interface layer 231 is electrically conductive. The interface layer 231 may include an adhesion sublayer, not shown in FIG. 2B, contacting the terminals 204, 205, and 206. The interface layer 231 may include a barrier sublayer, not shown in FIG. 2B, on the adhesion sublayer. The interface layer 231 may include a plating seed sublayer, not shown in FIG. 2B, on the barrier sublayer. The interface layer 231 may be formed by a sequence of thin film deposition processes.

A head mask 218 is formed over the interface layer 231. The head mask 218 exposes the interface layer 231 in areas for a subsequently-formed first extended head 219 and a subsequently-formed second extended head 220. The area for the first extended head 219 exposes the interface layer 231 over the first pillar 213, and extends past the first pillar 213 in at least one direction parallel to the connection surface 203. The area for the second extended head 220 exposes the interface layer 231 over the second pillar 214 and the third pillar 215, extends past the second pillar 214 in at least one direction parallel to the connection surface 203, and extends past the third pillar 215 in at least one direction parallel to the connection surface 203. The head mask 218 may include photoresist, and may be formed using a photolithographic process. Alternatively, the head mask 218 may be formed by a tape application process, an additive process such as material jetting or material extrusion, or a subtractive process such as laser ablation. The first extended head 219 and the second extended head 220 are shown in FIG. 2C.

Referring to FIG. 2C, the first pillar 213, the second pillar 214, and the third pillar 215 are formed concurrently on the interface layer 231 in the areas exposed by the pillar mask 212 by a plating process using a plating solution 232. The plating process is continued to concurrently form the first extended head 219 on the first pillar 213, and to form the second extended head 220 on the second pillar 214 and the third pillar 215, in the areas exposed by the head mask 218. The second extended head 220 is located over the second plate 209. The plating solution 232 may include copper ions, nickel ions or gold ions so that the pillars 213, 214, and 215, and the first extended head 219 and the second extended head 220, may include copper, nickel or gold. The plating process may be implemented as an electroplating process or as an electroless process. The pillars 213, 214, and 215 may have heights, perpendicular to the connection surface 203, of 1 micron to 100 microns, by way of example. The first extended head 219 and the second extended head 220 may have thicknesses, perpendicular to the connection surface 203, of 1 micron to 25 microns, by way of example. The pillars 213, 214, and 215 are thus mechanically coupled to the connection surface 203 through the interface layer 231. The first extended head 219 is directly electrically coupled to the first pillar 213, and extends past the first pillar 213 in at least one direction parallel to the connection surface 203. The second extended head 220 is directly electrically coupled to the second pillar 214, and extends past the second pillar 214 in at least one direction parallel to the connection surface 203. The microelectronic device 200 is separated from the plating solution 232 after the pillars 213, 214, and 215, and the first extended head 219 and the second extended head 220, are formed.

Referring to FIG. 2D, an isolation layer 223 is formed on the second extended head 220. The isolation layer 223 may be implemented as a solder mask, and may include, for example, epoxy, polyester, or resin, and may be formed by dispensing, screen printing, or a photolithographic process. In this example, the isolation layer 223 covers the second extended head 220 where exposed by the head mask 218.

Figure 2E:
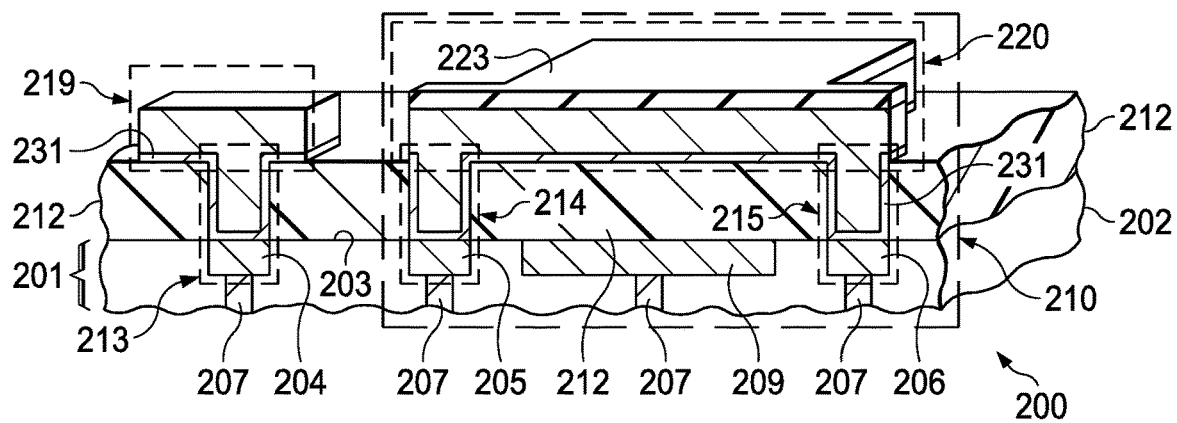

Referring to FIG. 2E, the head mask 218 of FIG. 2D is removed. The head mask 218 may be removed by dissolving in organic solvents, leaving the isolation layer 223 and the pillar mask 212 in place. After the head mask 218 is removed, the interface layer 231 of FIG. 2D is removed where exposed by the first extended head 219 and the second extended head 220, leaving the isolation layer 223 and the pillar mask 212 in place. The interface layer 231 may be removed by one or more wet etch processes using dilute aqueous acid solutions. The pillar mask 212 of this example provides a permanent support for the pillars 213, 214, and 215, and for the first extended head 219 and the second extended head 220.

Figure 2F:
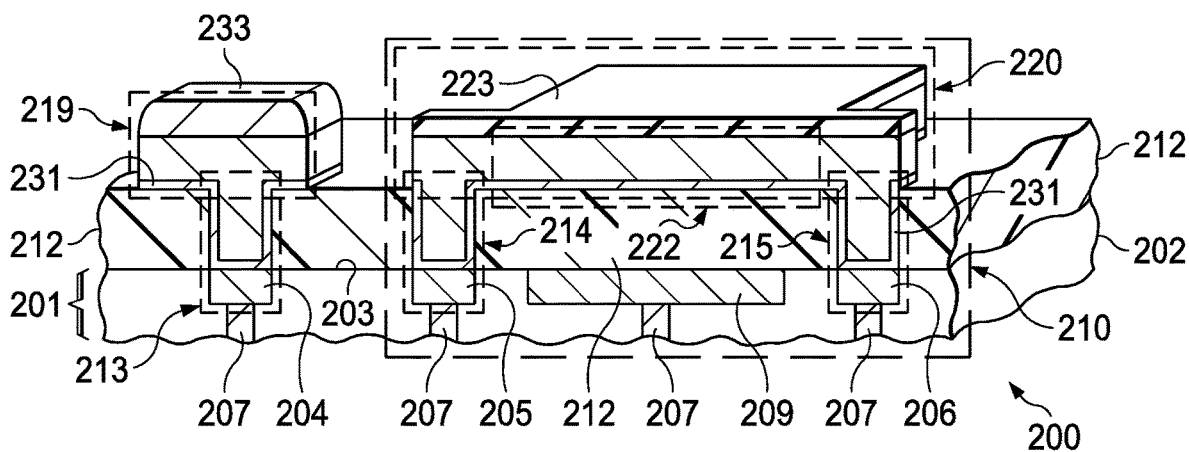

Referring to FIG. 2F, the first extended head 219 provides a bump pad of the microelectronic device 200. The bump pad may be implemented as a solder bump pad or an adhesive bump pad, by way of example. A solder bump 233 is formed on the first extended head 219. The solder bump 233 may be formed by dispensing solder paste onto the first extended head 219, followed by heating the solder paste in a reflow process to provide a low resistance interface between the solder bump 233 and the first extended head 219.

The second extended head 220 and the interface layer 231 contacting the second extended head 220 provide a first plate 222 of the integrated capacitor 210. The pillar mask 212 of this example extends between the first plate 222 of the integrated capacitor 210 and the second plate 209 of the integrated capacitor 210, which may advantageously provide a greater capacitance of the integrated capacitor 210 compared to a capacitor with no package dielectric material between plates of the capacitor. FIG. 2F depicts the completed microelectronic device 200.

Figure 3A:
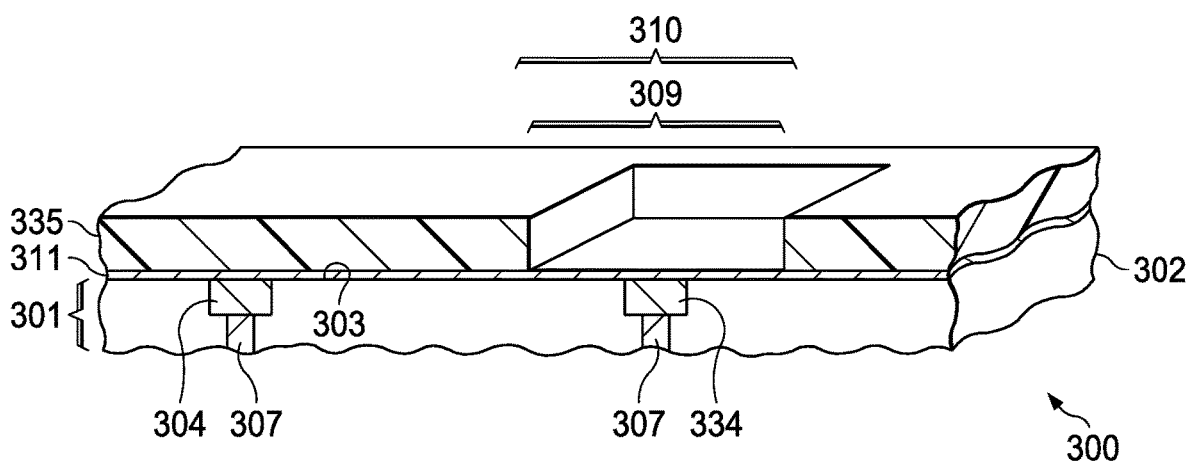
FIG. 3A through FIG. 3J are cross sections of a further example microelectronic device having an integrated capacitor, depicted in stages of a further example method of formation.

FIG. 3A through FIG. 3J are cross sections of a further example microelectronic device having an integrated capacitor, depicted in stages of a further example method of formation. Referring to FIG. 3A, the microelectronic device 300 includes a die 301. The die 301 may be implemented as any of the examples disclosed in reference to the die 101 of FIG. 1A, for example. The die 301 of this example has a substrate 302, which may be part of a wafer or workpiece containing additional die, or may contain only the die 301. The die 301 has a connection surface 303; the substrate 302 may extend to the connection surface 303 as depicted in FIG. 3A.

The die 301 of this example includes a first terminal 304 and a second terminal 334 at the connection surface 303. The first terminal 304 and the second terminal 334 are electrically conductive. The terminals 304 and 334 may be implemented as bump bond pads or through-substrate vias, by way of example. The terminals 304 and 334 may be electrically coupled to components in the die 301 by vias 307.

A first interface layer 311 is formed over the connection surface 303, contacting the terminals 304 and 334. The first interface layer 311 may have a composition and a sublayer structure similar to the first interface layer 111 of FIG. 1A. A capacitor mask 335 is formed over the first interface layer 311, exposing the first interface layer 311 in an area for a second plate 309 of the integrated capacitor 310. The capacitor mask 335 may include photoresist, formed by a photolithographic process, or may include a polymer, formed by screen printing or an additive process.

Figure 3B:
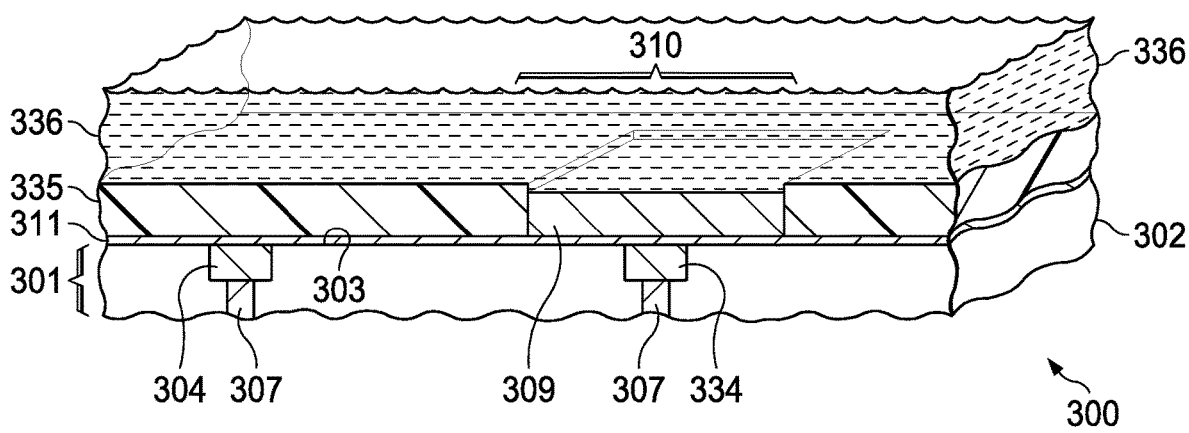

Referring to FIG. 3B, the second plate 309 of the integrated capacitor 310 is formed on the first interface layer 311 where exposed by the capacitor mask 335. The second plate 309 is formed by a first plating process using a first plating solution 336. The first plating solution 336 may include copper ions, nickel ions or gold ions, so that the second plate 309 may include copper, nickel or gold. The first plating process may be implemented as an electroplating process or an electroless process. The second plate 309 may have a thickness of 1 micron to 100 microns, by way of example. The microelectronic device 300 is separated from the plating solution 336 after the second plate 309 is formed.

Figure 3C:
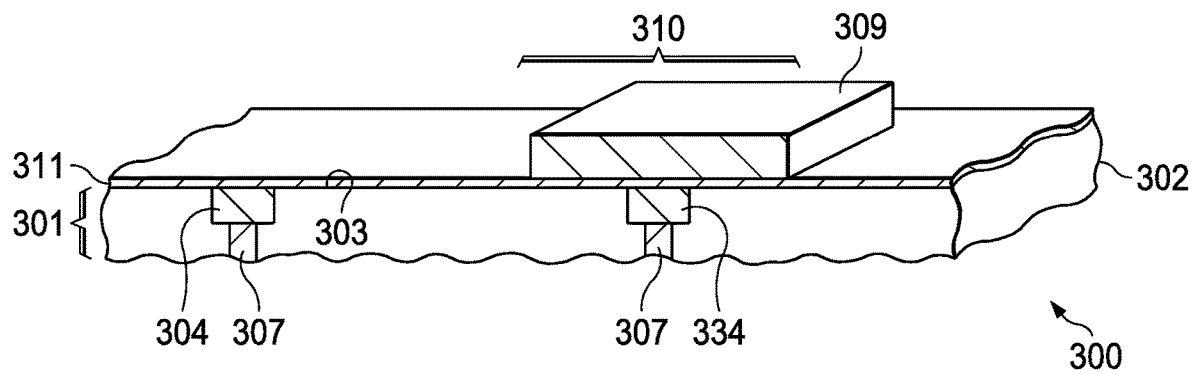

Referring to FIG. 3C, the capacitor mask 335 of FIG. 3B is removed, leaving the first interface layer 311 and the second plate 309 in place. The capacitor mask 335 may be removed by dissolving in organic solvents or organic acids, for example. Other methods for removing the capacitor mask 335 are within the scope of this example.

Figure 3D:
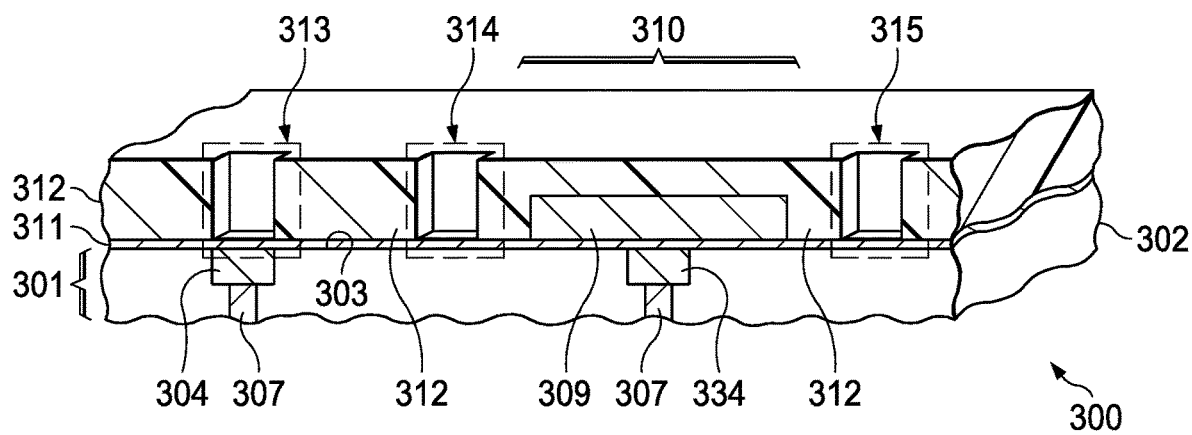

Referring to FIG. 3D, a pillar mask 312 is formed on the first interface layer 311, covering the second plate 309. The pillar mask 312 exposes the first interface layer 311 in areas for a first pillar 313, a second pillar 314, and a third pillar 315. The area for the first pillar 313 is located over the first terminal 304, the area for the second pillar 314 is located on one side of the second plate 309, and the area for the third pillar 315 is located on another side of the second plate 309. The pillar mask 312 may include photoresist, and may be formed using a photolithographic process. Alternatively, the pillar mask 312 may be formed by a tape application process, an additive process, or a subtractive process. The pillar mask 312 may have a thickness that is 1 micron to 50 microns greater than the thickness of the second plate 309, by way of example.

Figure 3E:
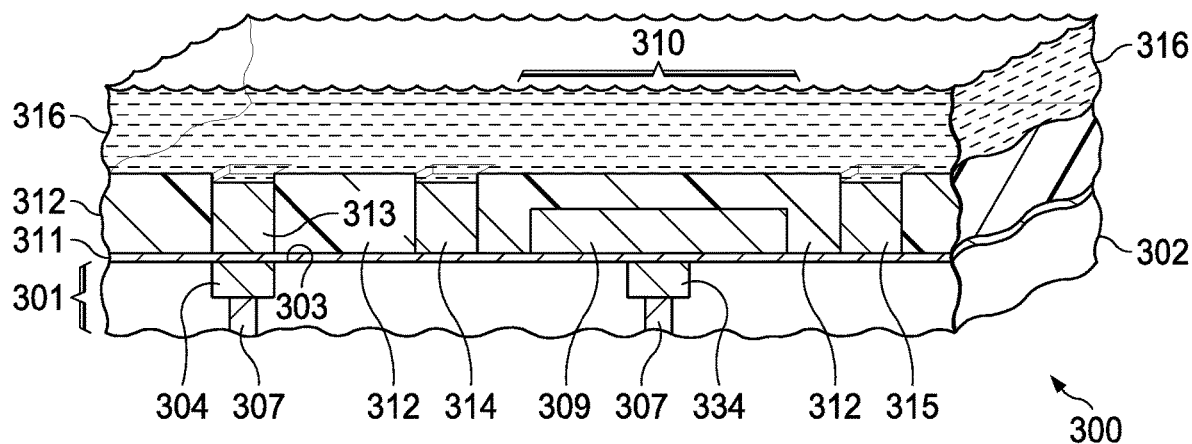

Referring to FIG. 3E, the first pillar 313, the second pillar 314, and the third pillar 315 are formed concurrently on the first interface layer 311 in the areas exposed by the pillar mask 312 by a second plating process using a second plating solution 316. The second plating solution 316 may include copper ions, nickel ions, or gold ions, so that the pillars 313, 314, and 315 include copper, nickel, or gold. The second plating process may be implemented as an electroplating process or as an electroless process. The pillars 313, 314, and 315 may have heights, perpendicular to the connection surface 303, of 1 micron to 50 microns greater than the thickness of the second plate 309, by way of example. The pillars 313, 314, and 315 are thus mechanically coupled to the connection surface 303 through the first interface layer 311. The microelectronic device 300 is separated from the second plating solution 316 after the pillars 313, 314, and 315 are formed. The pillar mask 312 is left in place for subsequent fabrication steps.

Figure 3F:
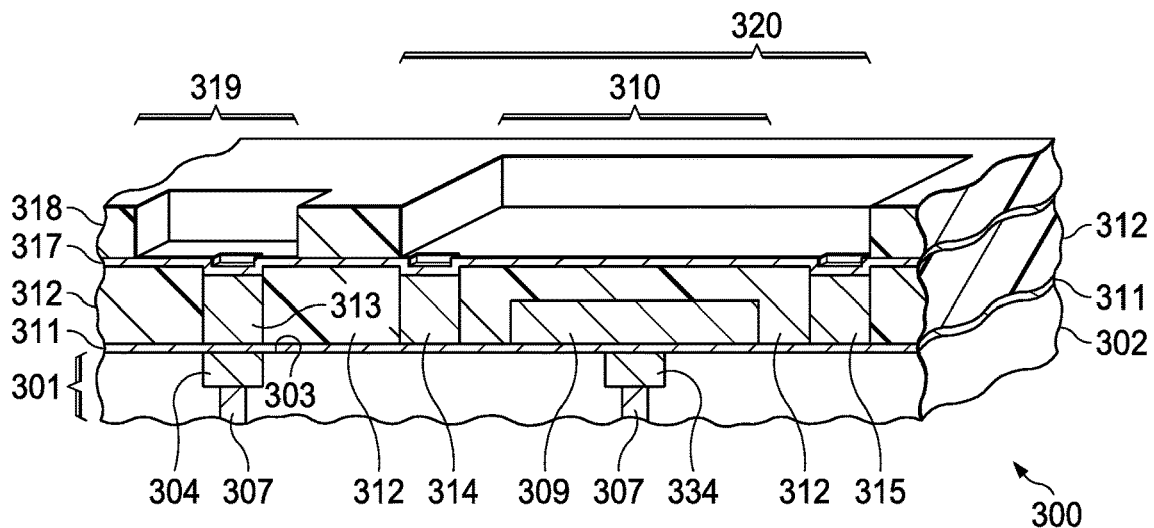

Referring to FIG. 3F, a second interface layer 317 is formed over the pillar mask 312, contacting the pillars 313, 314, and 315. The second interface layer 317 is electrically conductive. The second interface layer 317 may include an adhesion sublayer contacting the pillar mask 312 and the pillars 313, 314, and 315, and may include a plating seed sublayer contacting the adhesion sublayer. The adhesion sublayer of the second interface layer 317 may have a composition similar to that disclosed in reference to the adhesion sublayer of the first interface layer 311. The plating seed sublayer of the second interface layer 317 may have a composition similar to that disclosed in reference to the plating seed sublayer of the first interface layer 311.

Figure 3G:
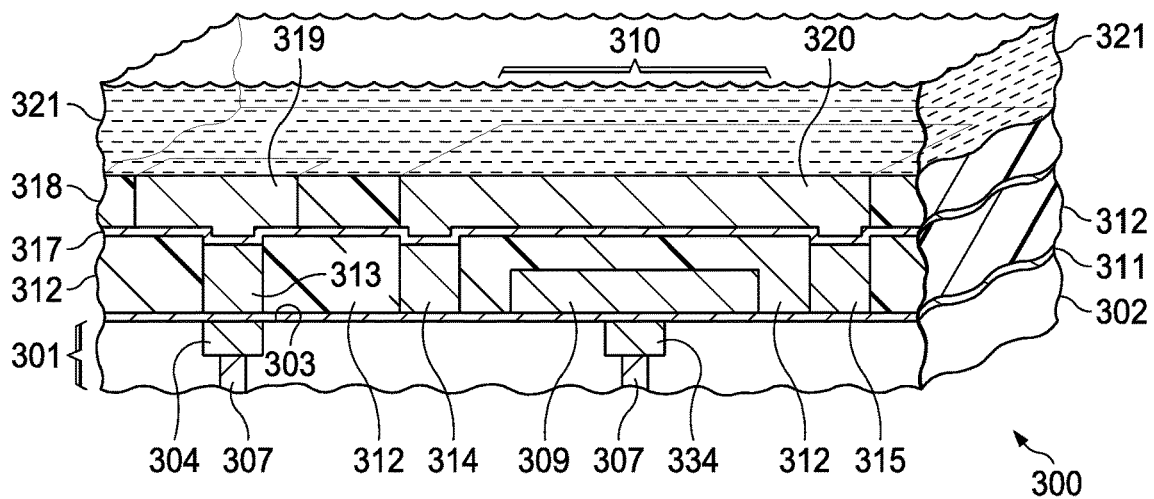

A head mask 318 is formed over the second interface layer 317. The head mask 318 exposes the second interface layer 317 in areas for a subsequently-formed first extended head 319 and a subsequently-formed second extended head 320; the first extended head 319 and the second extended head 320 are shown in FIG. 3G. Referring back to FIG. 3F, the area for the first extended head 319 exposes the second interface layer 317 over the first pillar 313, and extends past the first pillar 313 in at least one direction parallel to the connection surface 303. The area for the second extended head 320 exposes the second interface layer 317 over the second pillar 314 and the third pillar 315, extends past the second pillar 314 in at least one direction parallel to the connection surface 303, and extends past the third pillar 315 in at least one direction parallel to the connection surface 303. The head mask 318 may include photoresist, and may be formed using a photolithographic process. Alternatively, the head mask 318 may be formed by a tape application process, an additive process, or a subtractive process. The head mask 318 may have a different composition than the pillar mask 312, or may be formed by a different process than that used to form the pillar mask 312.

Referring to FIG. 3G, the first extended head 319 and the second extended head 320 are formed concurrently on the second interface layer 317 in the areas exposed by the head mask 318 by a third plating process using a third plating solution 321. The third plating solution 321 may include copper ions, nickel ions, or gold ions, so that the first extended head 319 and the second extended head 320 include copper, nickel, or gold. The third plating process may be implemented as an electroplating process or as an electroless process. The first extended head 319 and the second extended head 320 may have thicknesses, perpendicular to the connection surface 303, of 1 micron to 25 microns, by way of example. The first extended head 319 is electrically coupled to the first pillar 313 through the second interface layer 317, and extends past the first pillar 313 in at least one direction parallel to the connection surface 303. The second extended head 320 is electrically coupled to the second pillar 314 through the second interface layer 317, and extends past the second pillar 314 in at least one direction parallel to the connection surface 303. The microelectronic device 300 is separated from the third plating solution 321 after the first extended head 319 and the second extended head 320 are formed. The second extended head 320 is located over the second plate 309.

Figure 3H:
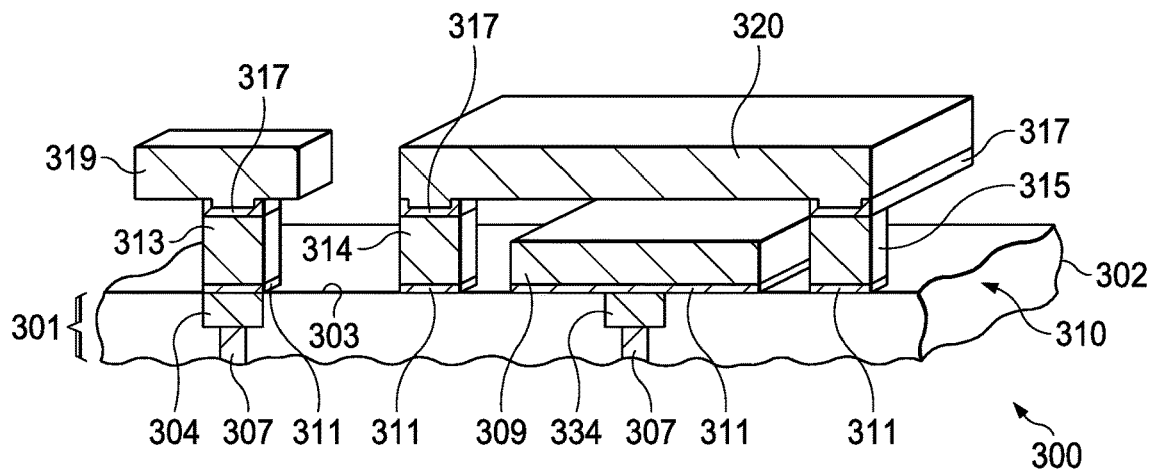

Referring to FIG. 3H, the head mask 318 of FIG. 3G is removed. The head mask 318 may be removed by dissolving in organic solvents or organic acids, leaving the first extended head 319 and the second extended head 320 in place. After the head mask 318 is removed, the second interface layer 317 of FIG. 3G is removed where exposed by the first extended head 319 and the second extended head 320. The second interface layer 317 may be removed by one or more wet etch processes using dilute aqueous acid solutions. After the second interface layer 317 is removed where exposed by the first extended head 319 and the second extended head 320, the pillar mask 312 of FIG. 3G is removed. The pillar mask 312 may be removed by dissolving in organic solvents or organic acids, leaving the first pillar 313, the second pillar 314, the third pillar 315, the first extended head 319, and the second extended head 320 in place. The pillar mask 312 may be removed by a process similar to that used to remove the head mask 318. After the pillar mask 312 is removed, the first interface layer 311 of FIG. 3G is removed where exposed by the pillars 313, 314, and 315, and the second plate 309. The first interface layer 311 may be removed by one or more wet etch processes using dilute aqueous acid solutions, which may be similar to wet etch processes used to remove the second interface layer 317. Removal of the first interface layer 311 may result in removal of the second interface layer 317 under the first extended head 319 and the second extended head 320, where exposed by the pillars 313, 314, and 315, as depicted in FIG. 3H.

Figure 3I:
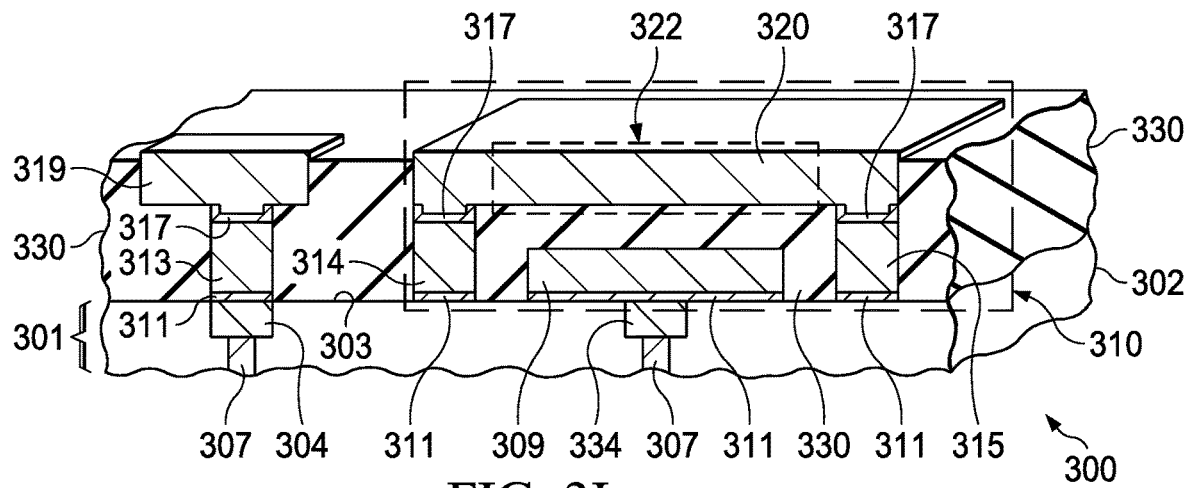

Referring to FIG. 3I, a package isolation structure 330 is formed on the die 301, laterally surrounding the pillars 313, 314, and 315, and contacting the first extended head 319, and the second extended head 320. The package isolation structure 330 is electrically non-conductive. The second extended head 320 provides a first plate 322 of the integrated capacitor 310. The package isolation structure 330 of this example extends between the first plate 322 of the integrated capacitor 310 and the second plate 309 of the integrated capacitor 310, which may advantageously provide a greater capacitance of the integrated capacitor 310 compared to a capacitor with no package dielectric material between plates of the capacitor. The package isolation structure 330 may be formed by injection molding or reaction injection molding, by way of example. The third pillar 315 may advantageously provide mechanical support for the second extended head 320 while the package isolation structure 330 is formed.

Figure 3J:
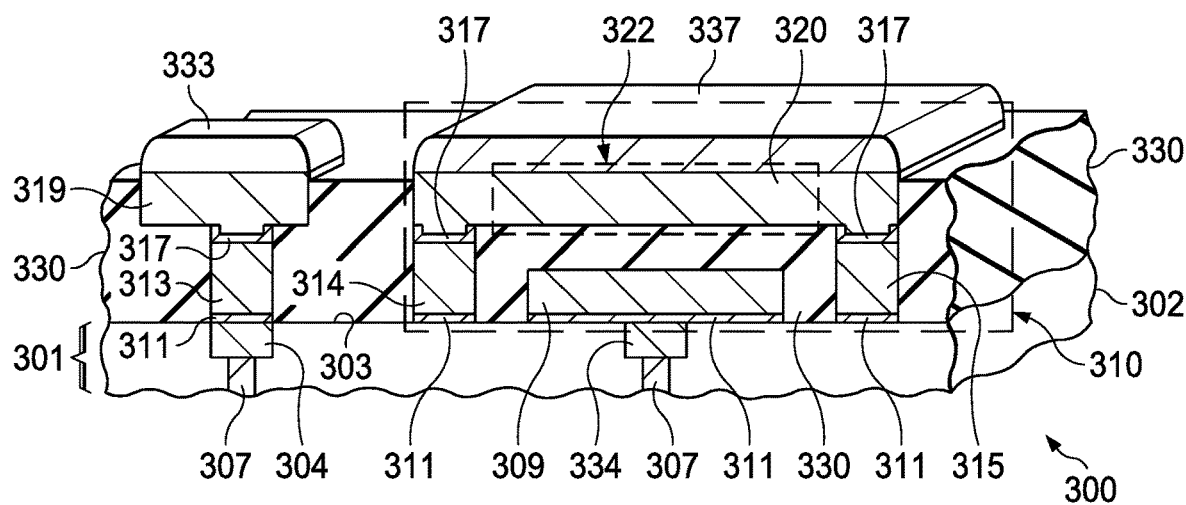

Referring to FIG. 3J, the first extended head 319 provides a bump pad of the microelectronic device 300. The bump pad may be implemented as a solder bump pad or an adhesive bump pad, by way of example. A first solder bump 333 is formed on the first extended head 319 and a second solder bump 337 is formed on the second extended head 320. The first solder bump 333 and the second solder bump 337 may be formed by dispensing solder paste onto the first extended head 319 and the second extended head 320, followed by heating the solder paste in a reflow process. FIG. 3J depicts the completed microelectronic device 300. In this example, the first plate 322 of the integrated capacitor 310 may be electrically coupled to a printed circuit board or chip carrier, not shown in FIG. 3J, through the second solder bump 337. The first plate is electrically coupled to one or more components in the die 301 through the first interface layer 311 and the second terminal 334.

Figure 4A:
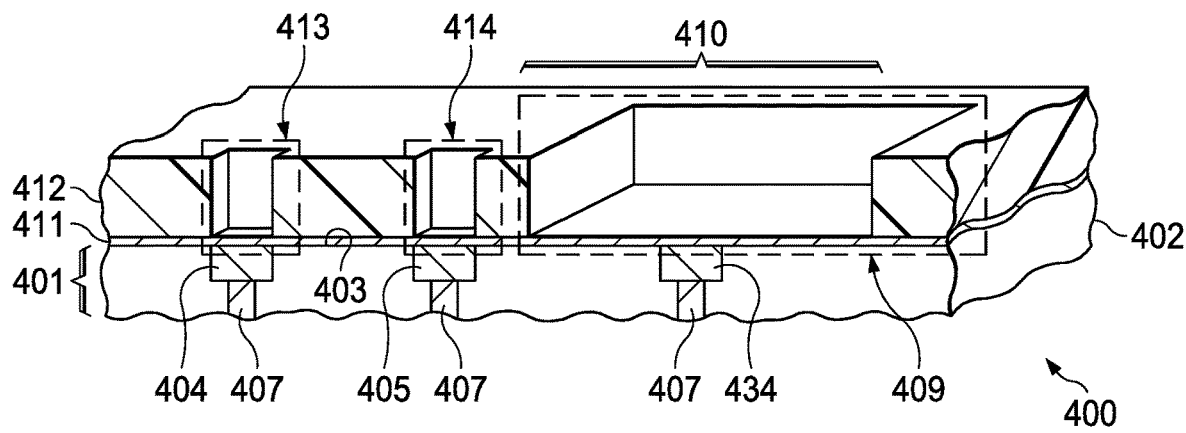
FIG. 4A through FIG. 4G are cross sections of another example microelectronic device having an integrated capacitor, depicted in stages of another example method of formation.

FIG. 4A through FIG. 4G are cross sections of another example microelectronic device having an integrated capacitor, depicted in stages of another example method of formation. Referring to FIG. 4A, the microelectronic device 400 includes a die 401. The die 401 may be implemented as any of the examples disclosed in reference to the die 101 of FIG. 1A, for example. The die 401 of this example has a substrate 402, which may be part of a wafer or workpiece containing additional die, or may contain only the die 401. The die 401 has a connection surface 403; the substrate 402 may extend to the connection surface 403 as depicted in FIG. 4A. The die 401 of this example includes a first terminal 404, a second terminal 405, and a third terminal 434 at the connection surface 403. The terminals 404, 405, and 434 are electrically conductive, and may be implemented as bump bond pads or through-substrate vias, by way of example. The terminals 404, 405, and 434 may be electrically coupled to components in the die 401 by vias 407.

A first interface layer 411 is formed over the connection surface 403, contacting the terminals 404, 405, and 434. The first interface layer 411 may have a composition and a sublayer structure similar to the first interface layer 111 of FIG. 1A.

A pillar mask 412 is formed on the first interface layer 411. The pillar mask 412 exposes the first interface layer 411 in areas for a first pillar 413, a second pillar 414, and a second plate 409 of the integrated capacitor 410. The area for the first pillar 413 is located over the first terminal 404, the area for the second pillar 414 is located over the second terminal 405, and the area for the second plate 409 is located over the third terminal 434. The pillar mask 412 may include photoresist, and may be formed using a photolithographic process, or may be formed by a tape application process, an additive process, or a subtractive process. The pillar mask 412 may have a thickness that is 1 micron to 100 microns, by way of example.

Figure 4B:
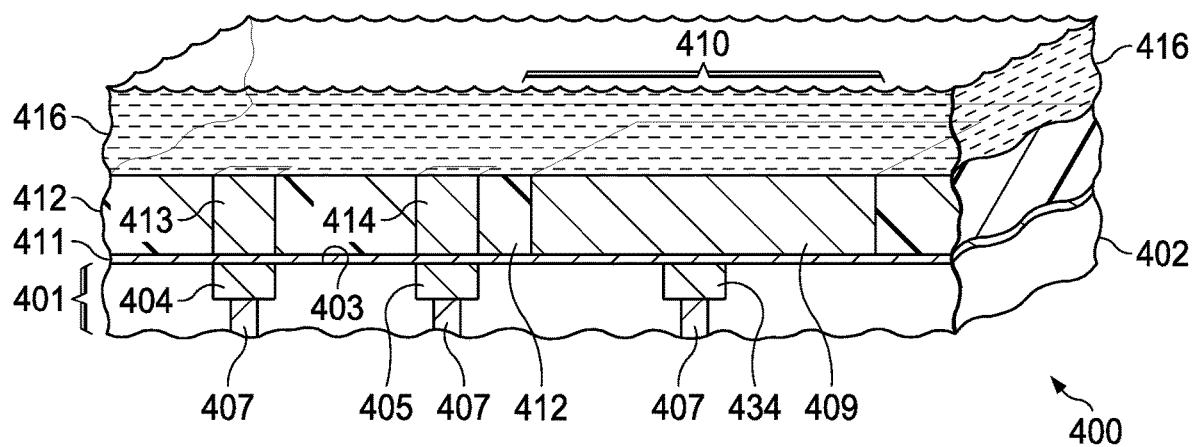

Referring to FIG. 4B, the first pillar 413, the second pillar 414, and the second plate 409 are formed concurrently on the first interface layer 411 in the areas exposed by the pillar mask 412 by a first plating process using a first plating solution 416. The first plating solution 416 may include copper ions, nickel ions, or gold ions, so that the pillars 413 and 414, and the second plate 409 include copper, nickel, or gold. The first plating process may be implemented as an electroplating process or as an electroless process. The pillars 413 and 414, and the second plate 409 may have heights, perpendicular to the connection surface 403, of 1 micron to 100 microns, by way of example. The pillars 413 and 414 are thus mechanically coupled to the connection surface 403 through the first interface layer 411. The microelectronic device 400 is separated from the first plating solution 416 after the pillars 413 and 414, and the second plate 409 are formed. The pillar mask 412 is left in place for subsequent fabrication steps.

Figure 4C:
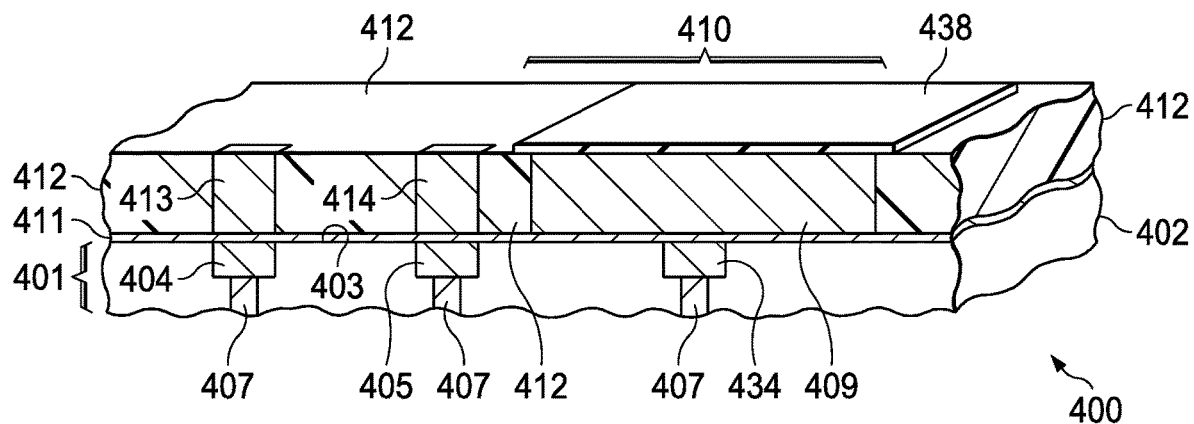

Referring to FIG. 4C, a capacitor dielectric layer 438 is formed over the second plate 409. The capacitor dielectric layer 438 may include an organic polymer such as epoxy or polyimide, a silicone polymer, or an inorganic material such as silicon dioxide particles in a binder material. The capacitor dielectric layer 438 may be formed by a photolithographic process, screen printing, or an additive process. The capacitor dielectric layer 438 may have a thickness of 100 nanometers to 10 microns, by way of example.

Figure 4D:
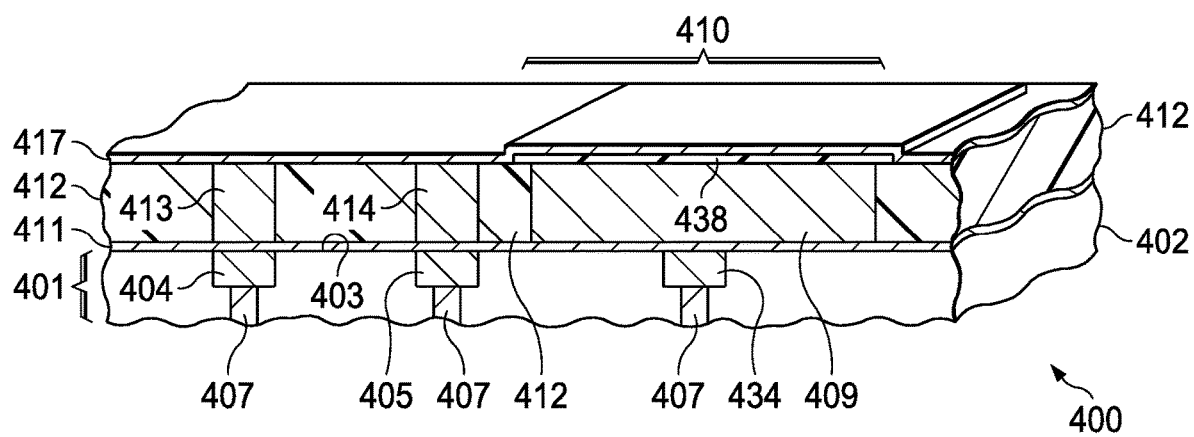

Referring to FIG. 4D, a second interface layer 417 is formed over the pillar mask 412, contacting the pillars 413 and 414, and extending over the capacitor dielectric layer 438. The second interface layer 417 is electrically conductive. The second interface layer 417 may include an adhesion sublayer contacting the pillar mask 412, the pillars 413 and 414, and the capacitor dielectric layer 438, and may include a plating seed sublayer contacting adhesion sublayer. The adhesion sublayer of the second interface layer 417 may have a composition similar to that disclosed in reference to the adhesion sublayer of the first interface layer 411. The plating seed sublayer of the second interface layer 417 may have a composition similar to that disclosed in reference to the plating seed sublayer of the first interface layer 411.

Figure 4E:
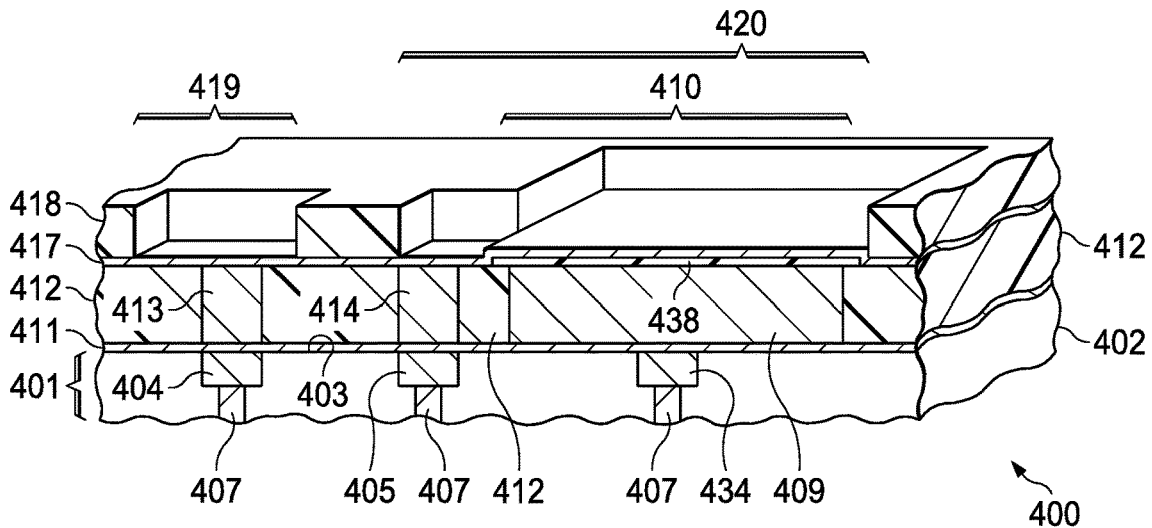
Figure 4F:
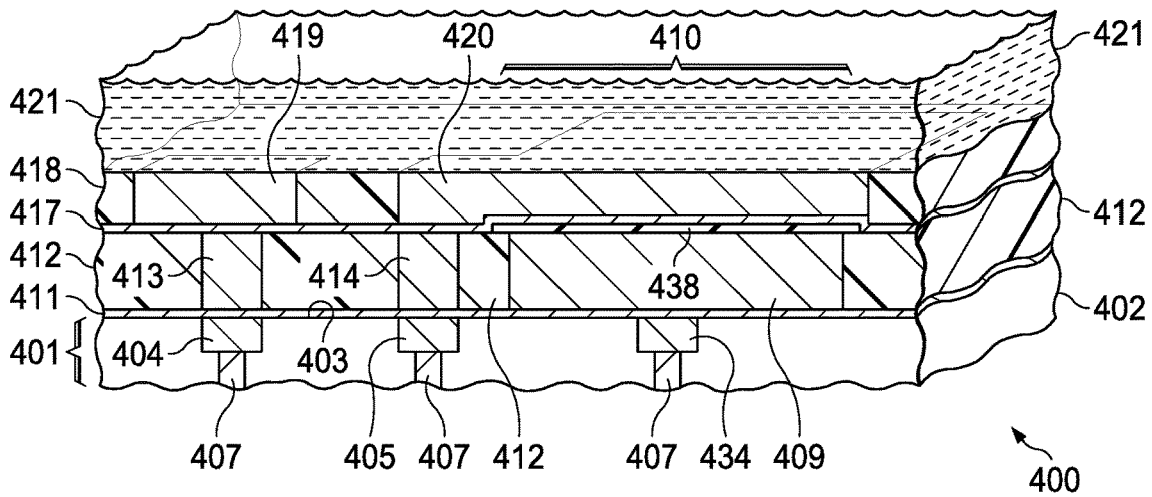

Referring to FIG. 4E, a head mask 418 is formed over the second interface layer 417. The head mask 418 exposes the second interface layer 417 in areas for a subsequently-formed first extended head 419 and a subsequently-formed second extended head 420; the first extended head 419 and the second extended head 420 are shown in FIG. 4F. Referring back to FIG. 4E, the area for the first extended head 419 exposes the second interface layer 417 over the first pillar 413, and extends past the first pillar 413 in at least one direction parallel to the connection surface 403. The area for the second extended head 420 exposes the second interface layer 417 over the second pillar 414 and the capacitor dielectric layer 438, and extends past the second pillar 414 in at least one direction parallel to the connection surface 403. The head mask 418 may include photoresist, and may be formed using a photolithographic process. Alternatively, the head mask 418 may be formed by a tape application process, an additive process, or a subtractive process. The head mask 418 may have a different composition than the pillar mask 412, or may be formed by a different process than that used to form the pillar mask 412.

Referring to FIG. 4F, the first extended head 419 and the second extended head 420 are formed concurrently on the second interface layer 417 in the areas exposed by the head mask 418 by a second plating process using a second plating solution 421. The second plating solution 421 may include copper ions, nickel ions, or gold ions, so that the first extended head 419 and the second extended head 420 include copper, nickel, or gold. The second plating process may be implemented as an electroplating process or as an electroless process. The first extended head 419 and the second extended head 420 may have thicknesses, perpendicular to the connection surface 403, of 1 micron to 25 microns, by way of example. The first extended head 419 is electrically coupled to the first pillar 413 through the second interface layer 417, and extends past the first pillar 413 in at least one direction parallel to the connection surface 403. The second extended head 420 is electrically coupled to the second pillar 414 through the second interface layer 417, and extends past the second pillar 414 in at least one direction parallel to the connection surface 403. The microelectronic device 400 is separated from the second plating solution 421 after the first extended head 419 and the second extended head 420 are formed. The second extended head 420 is located over the second plate 409.

Figure 4G:
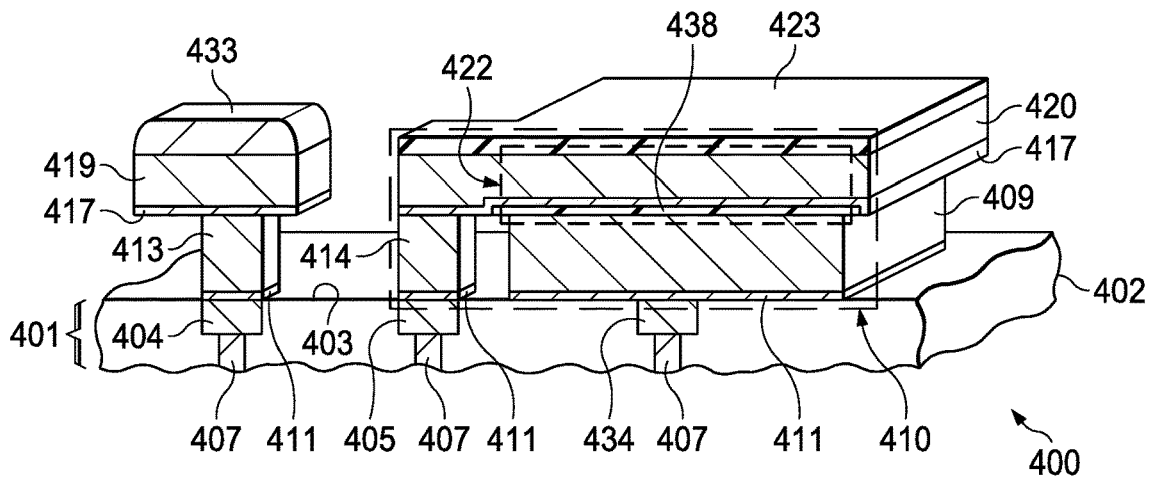

Referring to FIG. 4G, the head mask 418 of FIG. 4F is removed, leaving the first extended head 419 and the second extended head 420 in place. The second interface layer 417 of FIG. 4F is removed where exposed by the first extended head 419 and the second extended head 420. The pillar mask 412 of FIG. 4F is removed, leaving the first pillar 413, the second pillar 414, the second plate 409, the first extended head 419, and the second extended head 420 in place. The first interface layer 411 of FIG. 4F is removed where exposed by the pillars 413 and 414, and the second plate 409. The head mask 418, the second interface layer 417, the pillar mask 412, and the first interface layer 411 may be removed by processes disclosed in reference removal of corresponding masks and interface layers of other examples herein.

A isolation layer 423 may optionally be formed on the second extended head 420. The isolation layer 423 may be implemented as a solder mask, and may include, for example, epoxy, polyester, or resin, and may be formed by dispensing, screen printing, or a photolithographic process, by way of example. The isolation layer 423 may optionally be formed before the removing head mask 418. The first extended head 419 provides a bump pad of the microelectronic device 400. The bump pad may be implemented as a solder bump pad or an adhesive bump pad, by way of example. A first solder bump 433 is formed on the first extended head 419. The first solder bump 433 may be formed by a similar process to that disclosed in reference to the solder bump 233 of FIG. 2F.

FIG. 4G depicts the completed microelectronic device 400. The second extended head 420 and the second interface layer contacting the second extended head 420 provide a first plate 422 of the integrated capacitor 410. The first plate is electrically coupled to one or more components in the die 401 through the first interface layer 411 and the second terminal 414. The capacitor dielectric layer 438 separates the first plate 422 and the second plate 409, which may advantageously provide a high capacitance value for the integrated capacitor 410 of this example.

Figure 5A:
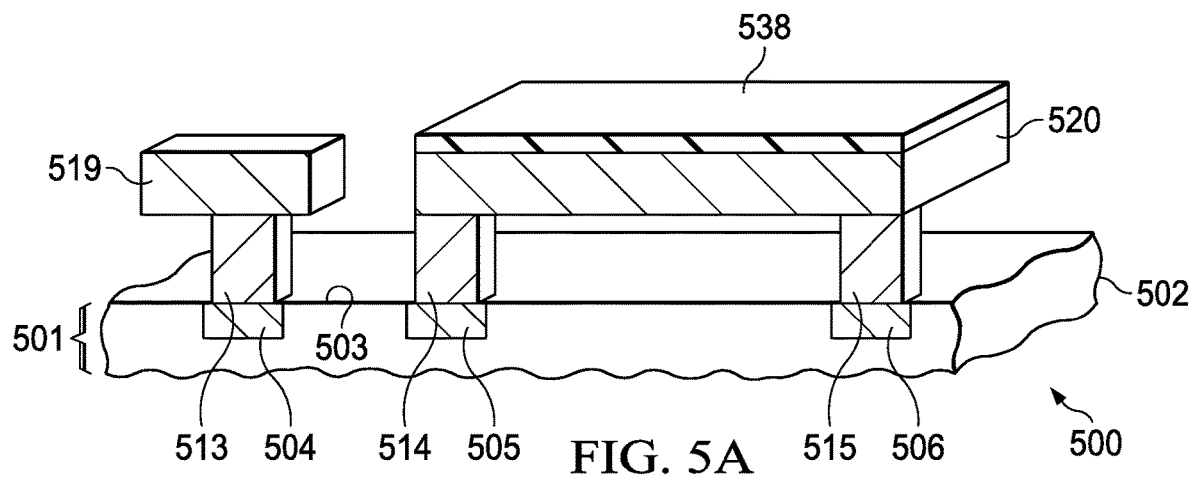
FIG. 5A through FIG. 5C are cross sections of a further example microelectronic device having an integrated capacitor, depicted in stages of a further example method of formation.
Figure 5B:
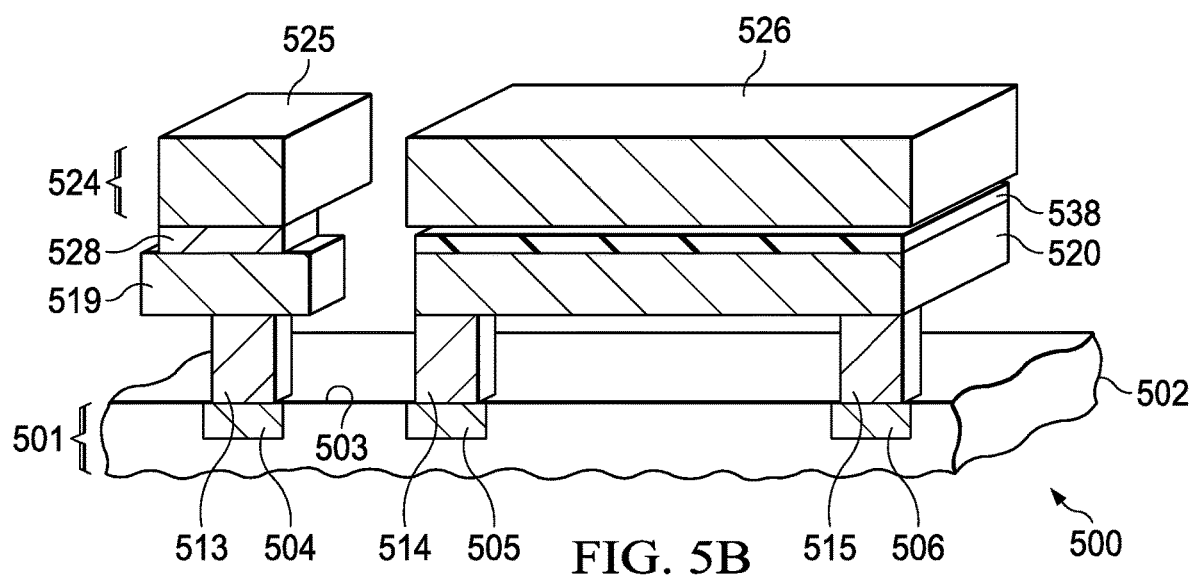
Figure 5C:
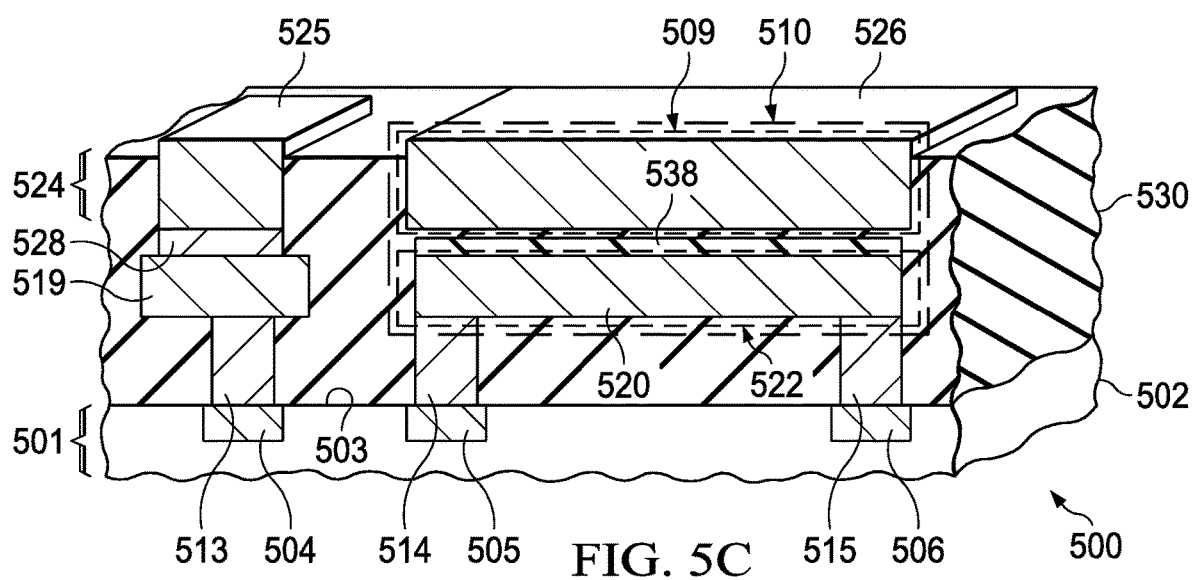

FIG. 5A through FIG. 5C are cross sections of a further example microelectronic device having an integrated capacitor, depicted in stages of a further example method of formation. Referring to FIG. 5A, the microelectronic device 500 includes a die 501. The die 501 may be implemented as any of the examples disclosed in reference to the die 101 of FIG. 1A, for example. The die 501 of this example has a substrate 502, which may be part of a wafer or workpiece containing additional die, or may contain only the die 501. The die 501 has a connection surface 503; the substrate 502 may extend to the connection surface 503 as depicted in FIG. 5A. The die 501 of this example includes a first terminal 504, a second terminal 505, and a third terminal 506 at the connection surface 503. The terminals 504, 505, and 506 are electrically conductive, and may be implemented as bump bond pads or through-substrate vias, by way of example. The terminals 504, 505, and 506 may be electrically coupled to components in the die 501.

A first pillar 513, a second pillar 514, and a third pillar 515 are formed concurrently on the first terminal 504, the second terminal 505, and the third terminal 506, respectively. The pillars 513, 514, and 515 are thus mechanically coupled to the connection surface 503. The pillars 513, 514, and 515 are electrically conductive. A first extended head 519 and a second extended head 520 are formed concurrently on the pillars 513, 514, and 515. The first extended head 519 contacts the first pillar 513, and extends past the first pillar 513 in at least one direction parallel to the connection surface 503. The second extended head 520 contacts the second pillar 514 and the third pillar 515, extends past the second pillar 514 in at least one direction parallel to the connection surface 503, and extends past the third pillar 515 in at least one direction parallel to the connection surface 503. The pillars 513, 514, and 515, the first extended head 519, and the second extended head 520 may be formed by any of the methods disclosed in the example herein. Alternatively, the pillars 513, 514, and 515, the first extended head 519, and the second extended head 520 may be formed by an additive process, such as 3 dimensional (3D) metal printing. In cases in which the pillars 513, 514, and 515 are formed by an additive process, the pillars 513, 514, and 515 are formed by the same additive process, so that the pillars 513, 514, and 515 are formed concurrently, that is, in a same operation, or simultaneously. The term "concurrently" includes cases in which a portion or all of the first pillar 513 is formed before a portion or all of the second pillar 514 is formed, as may occur when using an additive process having a limited number of print heads or material dispensing nozzles, and similarly for the first extended head 519 and the second extended head 520. Other methods for forming the pillars 513, 514, and 515 concurrently, and forming the first extended head 519 and the second extended head 520 concurrently, are within the scope of this example.

A capacitor dielectric layer 538 is formed over the second extended head 520, on a surface of the second extended head 520 opposite from the connection surface 503. The capacitor dielectric layer 538 may have a composition and may be formed by a method as disclosed in reference to the capacitor dielectric layer 438 of FIG. 4C.

Referring to FIG. 5B, a lead frame 524 of the microelectronic device 500 is provided. The lead frame 524 includes a first lead 525 and a second lead 526. The leads 525 and 526 may include any of the materials disclosed in reference to the lead frame 124 of FIG. 1F. The first extended head 519 provides a bump pad of the microelectronic device 500. The bump pad may be implemented as a solder bump pad or an adhesive bump pad, by way of example. The first lead 525 is electrically coupled to the first extended head 519 through a solder connection 528. The second lead 526 is located over the second extended head 520, and is electrically isolated from the second extended head 520 by the capacitor dielectric layer 538.

Referring to FIG. 5C, a package isolation structure 530 is formed on the die 501, laterally surrounding the pillars 513, 514, and 515, the first extended head 519, and the second extended head 520, and contacting the leads 525 and 526. The package isolation structure 530 is electrically non-conductive, and may include any of the materials disclosed in reference to the package isolation structure 130 of FIG. 1G.

The second extended head 520 provides a first plate 522 of the integrated capacitor 510. The second lead 526 provides a second plate 509 of the integrated capacitor 510, facing a side of the first plate 522 opposite from the connection surface 503. The capacitor dielectric layer 538 separating the first plate 522 from the second plate 509 may advantageously provide a high capacitance value for the integrated capacitor 510 of this example. The package isolation structure 530 of this example may optionally extend between the first plate 522 and the second plate 509, as depicted in FIG. 5C. FIG. 5C depicts the completed microelectronic device 500.

Various features of the examples disclosed herein may be combined in other manifestations of microelectronic devices. For example, the first pillar and second pillar of any microelectronic device may be formed concurrently as disclosed according to the methods disclosed in reference to FIG. 1A through FIG. 1G, FIG. 2A through FIG. 2F, FIG. 3A through FIG. 3J, or FIG. 4A through FIG. 4G. Similarly, the first extended head and the second extended head of any microelectronic device may be formed concurrently as disclosed according to the methods disclosed in reference to FIG. 1A through FIG. 1G, FIG. 2A through FIG. 2F, FIG. 3A through FIG. 3J, or FIG. 4A through FIG. 4G. Any of the integrated capacitors may have capacitor dielectric layers as shown in FIG. 4C or FIG. 5C. The second extended head of any microelectronic device may be electrically coupled to external terminals as depicted in FIG. 1G or FIG. 3J.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a die having a connection surface;
   a first pillar mechanically coupled to the connection surface, the first pillar being electrically conductive;
   a second pillar mechanically coupled to the connection surface, the second pillar being electrically conductive, wherein the first pillar and the second pillar have equal compositions of electrically conductive material;
   a first extended head electrically coupled to the first pillar, the first extended head being electrically conductive, the first extended head extending past the first pillar in a direction parallel to the connection surface;
   a second extended head electrically coupled to the second pillar, the second extended head being electrically conductive, the second extended head extending past the second pillar in a direction parallel to the connection surface, wherein:
      the first extended head and the second extended head have equal compositions of electrically conductive material;
      the first extended head provides a solder bump pad; and
      the second extended head provides at least a portion of a first plate of an integrated capacitor of the microelectronic device; and
   a second plate of the integrated capacitor, wherein the second plate is located in the die under the first plate.

2. The microelectronic device of claim 1, further comprising a package isolation structure between the first plate and the second plate, the package isolation structure being electrically non-conductive, wherein the package isolation structure laterally surrounds the first pillar and the second pillar.

3. The microelectronic device of claim 1, further comprising a lead frame, wherein the first plate is electrically coupled to a lead of the lead frame through an electrically conductive material.

4. The microelectronic device of claim 1, further comprising an isolation layer on a surface of the first plate located opposite from the connection surface, the isolation layer being electrically non-conductive.

5. The microelectronic device of claim 1, wherein the first pillar is electrically coupled to a terminal of the die, the terminal being located at the connection surface, the terminal being electrically conductive.

6. A method of forming a microelectronic device, comprising:
   providing a die having a connection surface;
   forming a first pillar and a second pillar concurrently on the connection surface, the first pillar and the second pillar being electrically conductive, the first pillar and the second pillar being mechanically coupled to the connection surface; and
   forming a first extended head and a second extended head concurrently, the first extended head being electrically coupled to the first pillar, and the second extended head being electrically coupled to the second pillar; wherein:
      the first extended head and the second extended head are electrically conductive;
      the first extended head extends past the first pillar in a direction parallel to the connection surface of the die;
      the second extended head extends past the second pillar in a direction parallel to the connection surface of the die;
      the first extended head provides a bump pad; and
      the second extended head provides at least a portion of a first plate of an integrated capacitor.

7. The method of claim 6, wherein a second plate of the integrated capacitor is located in the die.

8. The method of claim 6, further comprising forming a second plate of the integrated capacitor over the connection surface, before forming the second extended head.

9. The method of claim 8, wherein the second plate is formed concurrently with the first pillar and the second pillar.

10. The method of claim 6, further comprising:
    forming a second plate of the integrated capacitor; and
    forming a dielectric layer on the second plate, before forming the second extended head.

11. The method of claim 6, further comprising electrically coupling the bump pad to a lead frame of the microelectronic device, wherein the lead frame provides a second plate of the integrated capacitor.

12. The method of claim 6, further comprising:
    forming a second plate of the integrated capacitor; and
    forming a package isolation structure on the die, the package isolation structure being electrically non-conductive, wherein the package isolation structure laterally surrounds the first pillar and the second pillar, and extends between the first plate and the second plate.

13. The method of claim 6, further comprising forming an isolation layer on a surface of the first plate located opposite from the connection surface, the isolation layer being electrically non-conductive.

14. The method of claim 6, wherein the first pillar and the second pillar are formed by a plating process.

15. The method of claim 6, wherein the first extended head and the second extended head are formed by a plating process.

\* \* \* \* \*